(12) United States Patent
Takahashi et al.

(10) Patent No.: US 12,375,786 B2
(45) Date of Patent: Jul. 29, 2025

(54) APPARATUS, DISPLAY APPARATUS, PHOTOELECTRIC CONVERSION APPARATUS, ELECTRONIC EQUIPMENT, ILLUMINATION APPARATUS, AND MOVING OBJECT

(71) Applicant: CANON KABUSHIKI KAISHA, Tokyo (JP)

(72) Inventors: Tetsuo Takahashi, Kanagawa (JP); Kentaro Suzuki, Kanagawa (JP); Takayuki Ito, Kanagawa (JP); Hiroaki Sano, Kanagawa (JP); Yojiro Matsuda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/740,306

(22) Filed: Jun. 11, 2024

(65) Prior Publication Data

US 2024/0334752 A1  Oct. 3, 2024

Related U.S. Application Data

(63) Continuation of application No. 17/501,882, filed on Oct. 14, 2021, now Pat. No. 12,075,657.

(30) Foreign Application Priority Data

Oct. 23, 2020 (JP) ................................. 2020-178128

(51) Int. Cl.
*H10K 50/85* (2023.01)
*H04N 23/53* (2023.01)
(Continued)

(52) U.S. Cl.
CPC ............. *H04N 23/53* (2023.01); *H04N 23/56* (2023.01); *H04N 23/63* (2023.01);
(Continued)

(58) Field of Classification Search
CPC .. H10K 50/818; H10K 50/852; H10K 50/858; H10K 59/38; H10K 59/122
(Continued)

(56) References Cited

U.S. PATENT DOCUMENTS

2020/0321400 A1* 10/2020 Park ..................... H10K 50/865
2021/0305538 A1*  9/2021 Ito ..................... H10K 59/80518
(Continued)

FOREIGN PATENT DOCUMENTS

JP  2011060552 A  3/2011
JP  2013251173 A  12/2013
(Continued)

*Primary Examiner* — Christopher M Raabe
(74) *Attorney, Agent, or Firm* — Canon U.S.A., Inc. IP Division

(57) ABSTRACT

An apparatus including sub-pixels arranged on a substrate, the sub-pixels including a first, a second, and a third sub-pixels, each of the sub-pixels including a lower electrode, an insulating layer covering an end portion of the lower electrode, an organic layer, and an upper electrode in mentioned order starting from a side closer to the substrate, at least part of the organic layer being continuously arranged in at least two of regions between a position on a first lower electrode included in the first sub-pixel and a position on a second lower electrode included in the second sub-pixel, between the position on the second lower electrode and a position on a third lower electrode included in the third sub-pixel, and between the position on the third lower electrode and the position on the first lower electrode.

24 Claims, 14 Drawing Sheets

(51) Int. Cl.
    *H04N 23/56*     (2023.01)
    *H04N 23/63*     (2023.01)
    *H10K 50/818*     (2023.01)
    *H10K 50/852*     (2023.01)
    *H10K 50/858*     (2023.01)
    *H10K 59/122*     (2023.01)
    *H10K 59/38*     (2023.01)
    *H10K 59/80*     (2023.01)
    *H10K 102/00*     (2023.01)

(52) U.S. Cl.
    CPC ......... *H10K 50/818* (2023.02); *H10K 50/852* (2023.02); *H10K 50/858* (2023.02); *H10K 59/122* (2023.02); *H10K 59/38* (2023.02); *H10K 59/878* (2023.02); *H10K 59/879* (2023.02); *H10K 2102/3026* (2023.02)

(58) Field of Classification Search
    USPC .......................................................... 257/40
    See application file for complete search history.

(56) References Cited

U.S. PATENT DOCUMENTS

2022/0085335 A1\*   3/2022   Shimatsu ................ H10K 59/38
2024/0099038 A1\*   3/2024   Kubota .................. H05B 33/22

FOREIGN PATENT DOCUMENTS

| JP | 2018067500 A | 4/2018 |
|---|---|---|
| JP | 2020043066 A | 3/2020 |
| JP | 2020136260 A | 8/2020 |

\* cited by examiner

APPARATUS, DISPLAY APPARATUS, PHOTOELECTRIC CONVERSION APPARATUS, ELECTRONIC EQUIPMENT, ILLUMINATION APPARATUS, AND MOVING OBJECT

CROSS-REFERENCE TO RELATED APPLICATIONS

This application is a Continuation of co-pending U.S. patent application Ser. No. 17/501,882 filed Oct. 14, 2021, which claims priority benefit of Japanese Application No. 2020-178128 filed Oct. 23, 2020. The disclosures of the above-named applications are hereby incorporated by reference herein in their entireties.

BACKGROUND OF THE DISCLOSURE

Field of the Disclosure

The aspect of the embodiments relates to an apparatus (organic light emitting apparatus), a display apparatus, a photoelectric conversion apparatus, electronic equipment, an illumination apparatus, and a moving object.

Description of the Related Art

An organic light emitting element includes a cathode, an anode, and an organic compound layer positioned between the cathode and the anode, and operates as a light emitting device that emits light with recombination of electrons injected from the cathode and holes injected from the anode. Because the organic light emitting element can constitute a lightweight and flexible device, an organic light emitting apparatus, such as a display apparatus including the organic light emitting element, has attracted attention in recent years.

A display apparatus disclosed in Japanese Patent Laid-Open No. 2020-155339 is a display apparatus of the so-called "white light+CF" type in which white light is emitted from a light emitting layer and the emitted white light passes through a color filter (CF), whereby one of red light, green light, and blue light is taken out. The display apparatus disclosed in Japanese Patent Laid-Open No. 2020-155339 has an optical interference structure that a reflecting layer is positioned under the light emitting layer and an optical path length between a light emitting position in the light emitting layer and the reflecting layer is optimized for each color. The optical interference structure can adjust a color of light before entering the CF and can increase color purity of the light having passed through the CF.

Japanese Patent Laid-Open No. 2013-122835 discloses an organic light emitting element in which an insulating layer is formed to cover a peripheral edge portion of a lower electrode disposed per pixel and a light emitting region is defined by an opening in the insulating layer. Light generated from the light emitting layer is reflected at a wall surface of the opening in the insulating layer to increase light extraction efficiency. Furthermore, Japanese Patent Laid-Open No. 2013-122835 states that the light extraction efficiency can be increased by setting an inclination angle of the wall surface of the opening in the insulating layer relative to the lower electrode to an acute angle.

Japanese Patent Laid-Open No. 2013-122835 discloses the technique of reducing the inclination angle of the insulating layer covering the peripheral edge portion of the lower electrode relative to the lower electrode and reflecting the light generated from the light emitting layer at the reflecting layer, but it does not disclose a technique of changing the inclination angle of the insulating layer for each of the light emitting elements constituting pixels of the display apparatus. When the inclination angle of the insulating layer is reduced uniformly for all the light emitting elements, there arises an issue that a current leak between the pixels is more likely to occur.

SUMMARY OF THE DISCLOSURE

The aspect of the embodiments provides an apparatus including sub-pixels arranged on a substrate, the sub-pixels including a first sub-pixel, a second sub-pixel, and a third sub-pixel, each of the sub-pixels including a lower electrode, an insulating layer covering an end portion of the lower electrode, an organic layer, and an upper electrode in mentioned order starting from a side closer to the substrate, at least part of the organic layer being continuously arranged in at least two of regions between a position on a first lower electrode included in the first sub-pixel and a position on a second lower electrode included in the second sub-pixel, between the position on the second lower electrode and a position on a third lower electrode included in the third sub-pixel, and between the position on the third lower electrode and the position on the first lower electrode, wherein the insulating layer has at least one top portion in each of regions between the sub-pixel adjacent to the first sub-pixel and the first sub-pixel, between the sub-pixel adjacent to the second sub-pixel and the second sub-pixel, and between the sub-pixel adjacent to the third sub-pixel and the third sub-pixel, and wherein formulae (1) and (2) given below are satisfied on an assumption that a portion of the insulating layer between a first end portion of the insulating layer given by an end portion thereof positioned on the first lower electrode and a first top portion given by the top portion closest to the first end portion is called a first portion, that a portion of the insulating layer between a second end portion of the insulating layer given by an end portion thereof positioned on the second lower electrode and a second top portion given by the top portion closest to the second end portion is called a second portion, and that a portion of the insulating layer between a third end portion of the insulating layer given by an end portion thereof positioned on the third lower electrode and a third top portion given by the top portion closest to the third end portion is called a third portion:

$$\lambda_1 > \lambda_2 > \lambda_3 \quad (1)$$

$$\theta_1 < \theta_2 < \theta_3 \quad (2)$$

(where, in the formula (1), $\lambda_1$ denotes a wavelength at which light emitted from the first sub-pixel has maximum intensity, $\lambda_2$ denotes a wavelength at which light emitted from the second sub-pixel has maximum intensity, and $\lambda_3$ denotes a wavelength at which light emitted from the third sub-pixel has maximum intensity, and where, in the formula (2), $\theta_1$ denotes an inclination angle of the first portion relative to the substrate, $\theta_2$ denotes an inclination angle of the second portion relative to the substrate, and $\theta_3$ denotes an inclination angle of the third portion relative to the substrate).

Further features of the disclosure will become apparent from the following description of exemplary embodiments with reference to the attached drawings.

DESCRIPTION OF THE EMBODIMENTS

Details of organic light emitting apparatuses according to embodiments will be described below with reference to the drawings. Any of the following embodiments represents an example of the disclosure, and numerical values, shapes, materials, components, and arrangements and connection forms of the components in the embodiments are not purported to limit the scope of the disclosure. Although various features are mentioned in the embodiments, all those features are not always essential in the disclosure, and those features may be optionally combined with each other. In the attached drawings, the same or similar components are denoted by the same reference numbers, and duplicate description of those components is omitted.

In this Specification, words, such as "upper" and "lower", indicating arranged positions are used for convenience in explaining a positional relation between the components with reference to the drawings. The positional relation between the components changes case by case depending on a direction looking at the components. Accordingly, expressions indicating the positional relation are not limited to the words used in this Specification and can be replaced with other ones as appropriate depending on situations. Furthermore, the words "upper" and "lower" are each not to be interpreted as implying a state in which one component is positioned right above or under the other component and both the components are in direct contact with each other.

For example, an expression "an electrode B on an insulating layer A" does not require the electrode B to be formed on the insulating layer A in direct contact with the insulating layer A and does not exclude the case in which another component is present between the insulating layer A and the electrode B.

In this Specification, an expression "substantially parallel" implies a state in which two straight lines or two planes are arranged at an angle of −15° or more and 15° or less formed therebetween. In this Specification, an expression "continuously arranged between A and B" implies that the relevant component is continuously arranged from A to B without interruption. In this Specification, a word "height" indicates a distance measured from an upper surface (first surface) of a substrate 1 upward. A portion parallel to the upper surface (first surface) of the substrate 1 may be designated, and the "height" may be specified on the basis of the designated reference.

First Embodiment

An organic light emitting apparatus according to a first embodiment of the disclosure will be described below with reference to FIGS. 1 to 3.

Overall Configuration of Organic Light Emitting Apparatus

Figure 1:
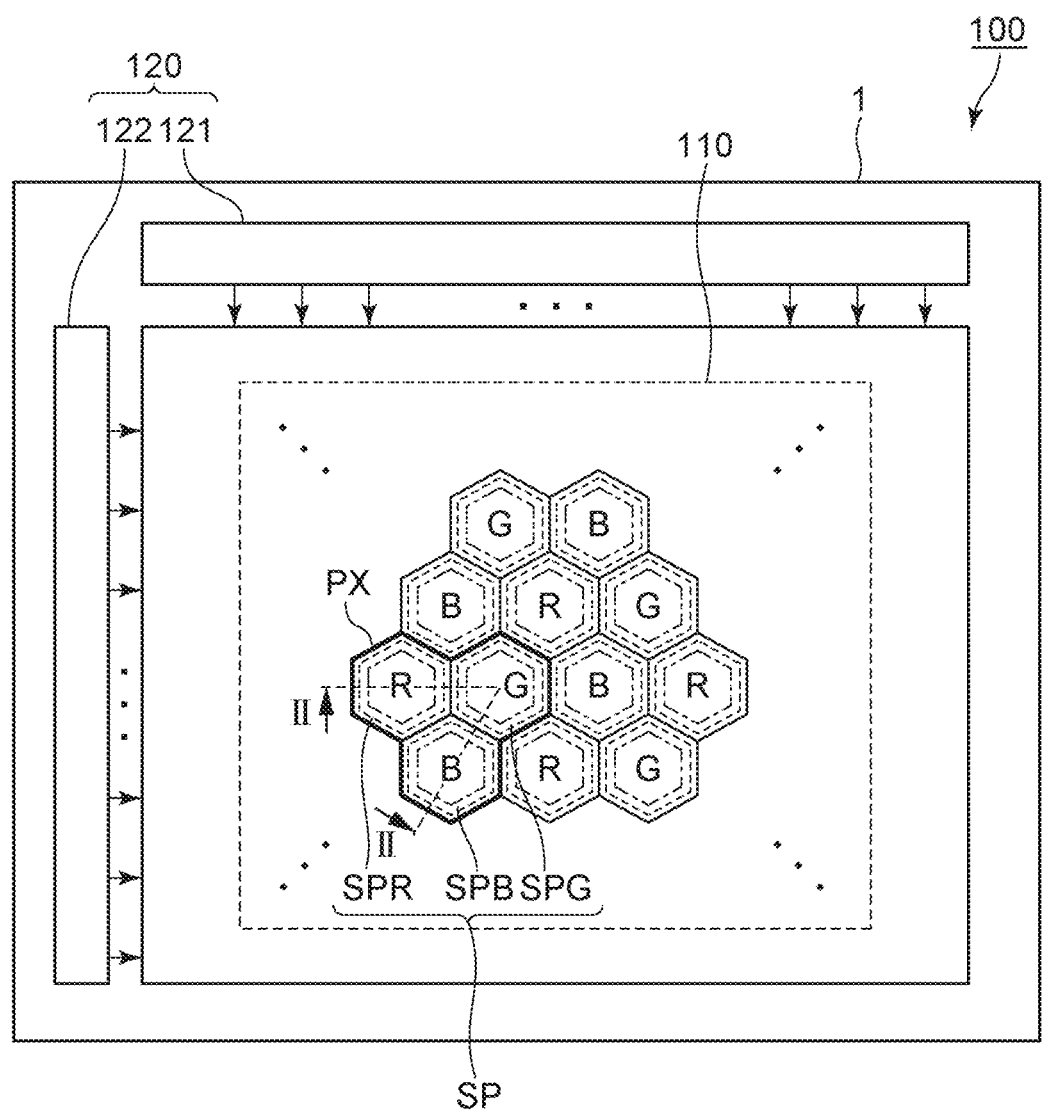
FIG. 1 is a plan view illustrating a configuration of an organic light emitting apparatus according to a first embodiment.

FIG. 1 is a plan view illustrating a configuration of the organic light emitting apparatus 100 according to the first embodiment. The organic light emitting apparatus 100 includes a display region 110 where multiple pixels PX are arranged on a substrate 1 (on a substrate) in a two-dimensional array, and a peripheral circuit 120. The peripheral circuit 120 is a circuit for displaying an image in the display region 110 and may include a signal line drive circuit 121 (signal output circuit) and a signal line drive circuit 122 (vertical scan circuit) which are drivers for displaying the image.

Each of the pixels PX includes multiple sub-pixels SP. In this embodiment, each of the pixels PX includes three kinds of sub-pixels SP, namely a first sub-pixel SPR emitting light of a first color, a second sub-pixel SPG emitting light of a second color, and a third sub-pixel SPB emitting light of a third color. Here, the first color, the second color, and the third color are assumed to be, for example, red, green, and blue, respectively. The configuration of the pixel PX described above is an example, and the pixel configuration is not limited to the above-described one. In another example, each of the pixels PX may include a fourth sub-pixel SPW emitting light of a fourth color in addition to the first sub-pixel SPR, the second sub-pixel SPG, and the third sub-pixel SPB. The fourth color may be, for example, white or yellow. Moreover, this embodiment represents an example in which the sub-pixels SP are arranged in a delta array, but the disclosure is not limited to such an example. The sub-pixels may be arranged in a stripe array, a square array, or a Bayer array.

Configuration of Light Emitting Element

Figure 2:
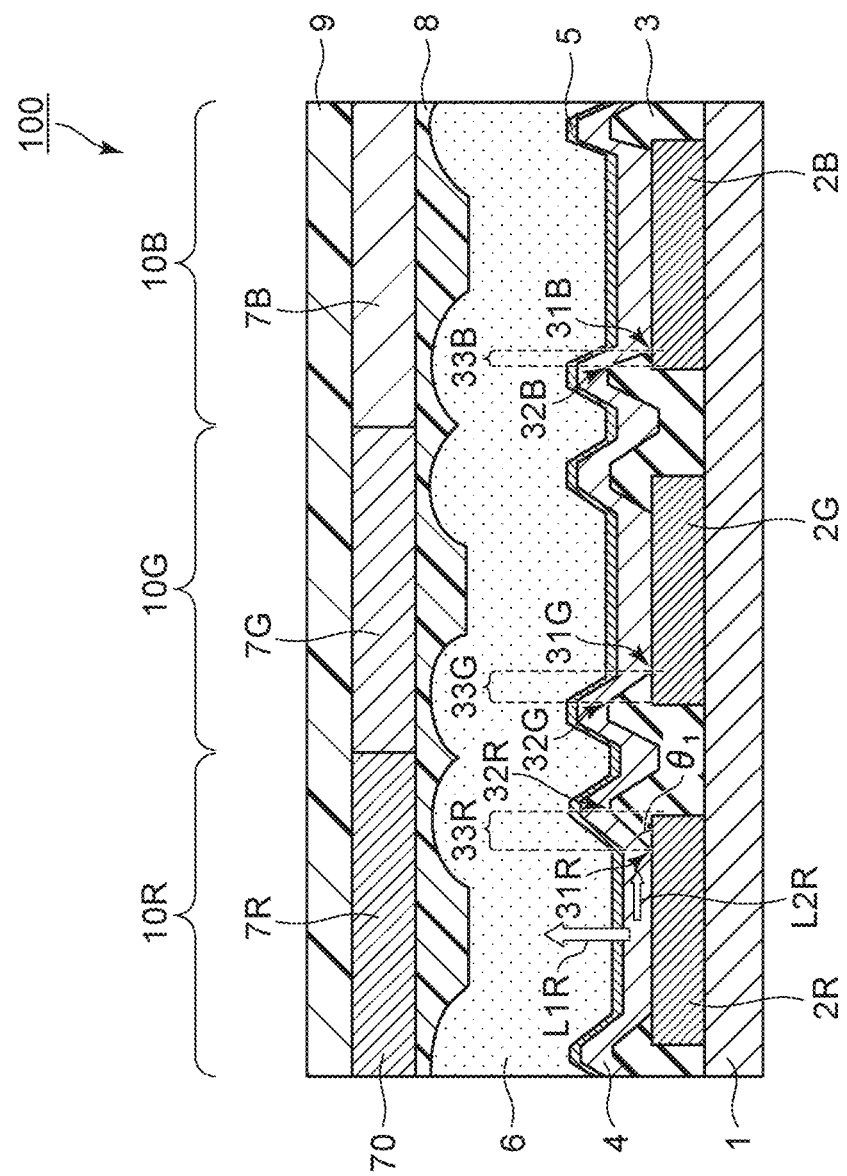
FIG. 2 is a sectional view illustrating the configuration of the organic light emitting apparatus according to the first embodiment.

FIG. 2 is a schematic sectional view taken along a line segment II-II in FIG. 1. Each of the sub-pixels SP includes a light emitting element 10 arranged on the upper surface (first surface) of the substrate 1. FIG. 2 illustrates the three sub-pixels SP belonging to one of the pixels PX that are included in the organic light emitting apparatus 100. The first sub-pixel SPR includes a first light emitting element 10R, the second sub-pixel SPG includes a second light emitting element 10G, and the third sub-pixel SPB includes a third light emitting element 10B. The first light emitting element 10R is a light emitting element that emits the light of the first color, the second light emitting element 10G is a light emitting element that emits the light of the second color, and the third light emitting element 10B is a light emitting element that emits the light of the third color. In this Specification, when particular one of the light emitting elements 10 is referred to, the relevant light emitting element is denoted by adding a suffix to the reference number like the light emitting element "10R". When the light emitting element is referred to without specifying the kind of the light emitting element, the light emitting element is denoted simply by the light emitting element "10". The above point is similarly applied to the other components.

Each of the light emitting elements 10 includes a lower electrode 2, an insulating layer 3 covering an end portion of the lower electrode 2, an organic layer 4 including a light emitting layer, and an upper electrode 5 that are laminated in the mentioned order starting from an upper surface side of the substrate 1 (from a side closer to the substrate). The organic light emitting apparatus 100 according to this embodiment is a top emission device in which light is taken out from the upper electrode 5. The organic light emitting apparatus 100 further includes a protective layer 6 arranged to cover the upper electrode 5, a first planarization layer 8, a second planarization layer 9, and a color filter layer 70.

The color filter layer 70 includes a first color filter 7R, a second color filter 7G, and a third color filter 7B. The first color filter 7R is a color filter allowing the light of the first color to pass therethrough, the second color filter 7G is a color filter allowing the light of the second color to pass therethrough, and the third color filter 7B is a color filter allowing the light of the third color to pass therethrough. Those color filters 7 are disposed in a one-to-one relation to the light emitting elements 10 and are arranged corresponding to the light emitting regions of the light emitting elements 10, respectively. In the plan view of FIG. 1, the color filter 7 included in each sub-pixel SP (light emitting element 10) is denoted by a solid line. Furthermore, in FIG. 1, an outer edge of the lower electrode 2 included in each sub-pixel SP is denoted by a dotted line, and an opening in the insulating layer 3 is denoted by a one-dot-chain line. As described later, the organic layer 4 is in contact with the lower electrode 2 in the opening in the insulating layer 3, and a region where the organic layer 4 and the lower electrode 2 are in contact with each other serves as the light emitting region of each sub-pixel SP. Hence the light emitting region of each sub-pixel SP is the region denoted by the one-dot-chain line in FIG. 1. As illustrated in FIG. 1, each color filter 7 is arranged to lie over a center of the light emitting region of the corresponding light emitting element 10 in the plan view.

In this embodiment, the organic layer 4 included in each light emitting element 10 emits white light. Each of the color filters 7R, 7G and 7B separates one of RGB lights from the white light emitted from the organic layer 4 by allowing the relevant light to selectively pass therethrough, and then outputs the separated light to the outside. At least part of the color filters included in the color filter layer 70 may be a color conversion layer that absorbs the light emitted from the organic layer and outputs light after conversion to another color. The color conversion layer may contain a quantum dot (QD). The color filter layer 70 may include four or more kinds of color filters. In addition, the light emitted from the organic layer 4 may not need to be the white light.

The substrate 1 is a plate member with the first surface. The various components are laminated on the first surface of the substrate 1, whereby the organic light emitting apparatus 100 is formed. The substrate 1 may be a semiconductor substrate such as a silicon substrate, or an insulator substrate made of, for example, glass, quartz, or resin. Furthermore, the substrate 1 may have flexibility.

A drive circuit layer (not illustrated) including transistors electrically connected to the lower electrode 2 may be formed on the substrate 1. In this embodiment, a drive circuit formed in the drive circuit layer is a pixel drive circuit of the active-matrix type. Hence it can be said that the organic light emitting apparatus 100 is an active-matrix display apparatus. The drive circuit layer may be formed by being laminated on the substrate 1, or part of the drive circuit layer may be formed directly in the substrate 1 by a semiconductor process. The drive circuit layer may include transistors, wiring layers, and an insulator positioned between the wiring layers. The insulator is, for example, an interlayer insulating layer made of an inorganic material such as silicon oxide (SiOx), silicon nitride (SiNx), or silicon oxynitride (SiON), or made of an organic material such as polyimide or polyacrylate. The interlayer insulating layer has a planar upper surface and is often called a planarization layer from the purpose of reducing unevenness of a surface that serves as an underground in a step of forming the lower electrode 2. When the substrate 1 includes the drive circuit layer, the term "substrate" may be regarded as including the drive circuit layer as well. When the term "substrate" is regarded as including the drive circuit layer as well, an upper surface of the uppermost interlayer insulating layer in the drive circuit layer can be regarded as the first surface. In this embodiment, because the lower electrode 2 is formed on the first surface, a lower surface of the lower electrode 2 coincides with the first surface. Accordingly, the lower surface of the lower electrode 2 may be regarded as the first surface.

The lower electrode 2 is an anode (positive electrode) and is arranged to be electrically separated by the insulating layer 3 for each light emitting element 10. In other words, the lower electrode 2 is arranged to be electrically separated per sub-pixel. It can also be said that the light emitting elements 10 independently include the lower electrodes 2 in a one-to-one relation. The lower electrode 2 is also called a pixel electrode or an individual electrode. In this embodiment, the lower electrode 2 functions as not only the anode, but also a reflecting layer that reflects the light generated from the organic layer 4 and increases emission efficiency of the light emitting element 10. To enhance the function as the reflecting layer, the lower electrode 2 may be made of a metal material with a reflectance of 80% or more for a light emission wavelength of the organic layer 4. Here, the light emission wavelength of the organic layer 4 is a wavelength of the light emitted from the organic layer 4 at which light intensity is maximum. For example, a metal such as Al (aluminum) or Ag (silver), or an alloy obtained by adding, for example, Si, Cu, Ni or Nd to any of the above-mentioned metals can be used as a material of the lower electrode 2. Alternatively, a metal material with a reflectance of 80% or more for light in a visible light range may be used as the material of the lower electrode 2. The lower electrode 2 may have a layered structure including a barrier layer. A metal such as Ti, W, Mo or Au, or an alloy of any of those metals may be used as a material of the barrier layer. The barrier layer may be a metal layer positioned on an upper surface of the lower electrode 2.

The insulating layer 3 is arranged on both the lower electrode 2 and the substrate 1 and covers the end portion of the lower electrode 2. The insulating layer 3 may include a portion positioned on the lower electrode 2 and a portion positioned at the same height as the lower electrode 2. The portion of the insulating layer 3 arranged on the lower electrode 2 is positioned between the lower electrode 2 and the organic layer 4. The lower electrode 2 includes a first region covered with the insulating layer 3 and a second region not covered with the insulating layer 3 and covered with the organic layer. It can be said that the first region is not in contact with the organic layer 4 and the second region is in contact with the organic layer 4. The second region is called an opening in the insulating layer 3 or simply an opening. This is because, in the plan view looking from above, the second region can be regarded as a recess formed in a state surrounded by the insulating layer 3. The second region is the light emitting region of each light emitting element 10. Thus, the shape of the light emitting region in the plan view looking from above may be a shape defined by the insulating layer 3. The shape of the insulating layer 3 is not limited to the one illustrated in FIG. 2 insofar as the insulating layer 3 fulfills the role of electrically separating the lower electrodes 2 of the light emitting elements 10. The insulating layer 3 is also called a pixel separation film, a partition, or a bank.

The insulating layer 3 has an inclined portion on an upper side. The upper side can also be said as being the opposite side to the substrate 1 or the same side as the organic layer 4. Assume here that one light emitting element 10 including the lower electrode 2 of which end portion is covered with the insulating layer 3 is a light emitting element A and another light emitting element 10 adjacent to the light emitting element A is a light emitting element B. In this case, the insulating layer 3 has at least one top portion between the lower electrode 2 included in the light emitting element A and the lower electrode 2 included in the light emitting element B. The top portion implies a portion in which, when looking at the insulating layer 3 while following its upper surface from the lower electrode 2 of the light emitting element A in a cross-section including the light emitting element A and the light emitting element B, an inclination of the insulating layer 3 changes from an upward slope to a downward slope. The top portion may include a flat portion. The insulating layer 3 has the at least one top portion for each light emitting element 10. Thus, the insulating layer 3 has the at least one top portion between the first light emitting element 10R and another adjacent light emitting element 10, between the second light emitting element 10G and another adjacent light emitting element 10, and between the third light emitting element 10B and another adjacent light emitting element 10. The first light emitting element 10R, the second light emitting element 10G, and the third light emitting element 10B may be read as the first sub-pixel SPR, the second sub-pixel SPG, and the third sub-pixel SPB, respectively. The insulating layer 3 may be continuously arranged from the lower electrode 2 included in the light emitting element A to the lower electrode 2 included in the light emitting element B, or may be separated between the lower electrode 2 included in the light emitting element A and the lower electrode 2 included in the light emitting element B. The inclined portion of the insulating layer 3 will be described later.

The insulating layer 3 may be formed by, for example, a chemical vapor deposition (CVD) method or a physical vapor deposition (PVD) method. The insulating layer 3 may be made of, for example, silicon nitride (SiNx), silicon oxide (SiOx), or silicon oxynitride (SiON). The insulating layer 3 may be formed of a layered film of the above-mentioned materials. An inclination angle of the inclined portion of the insulating layer 3 can be controlled depending on conditions of anisotropic etching or isotropic etching. Alternatively, the inclination angle of the insulating layer 3 may be controlled by controlling an inclination angle of a layer that is positioned under the insulating layer 3. An upper surface of the insulating layer 3 may have unevenness that is produced by processing such as etching, or by laminating an additional layer.

The organic layer 4 is positioned between the lower electrode 2 and the upper electrode 5. The organic layer 4 is continuously arranged on both the lower electrode 2 and the insulating layer 3 in common to the multiple light emitting elements 10. It can also be said that the multiple light emitting elements 10 share the single organic layer 4. The organic layer 4 may be arranged in common to the multiple sub-pixels SP constituting one pixel PX. The organic layer 4 may be separated between the adjacent pixels PX or may be arranged in common to the multiple pixels PX. The organic layer 4 may be integrally formed over the entirety of the display region 110 where the organic light emitting apparatus 100 displays an image. When the organic layer 4 is constituted by multiple layers, at least part of the layers may be continuously arranged over the multiple light emitting elements 10. When the sub-pixel SP has a very small size, it is particularly effective to arrange the organic layer 4 in common to the multiple sub-pixels SP.

Assume now that each of the pixels PX included in the organic light emitting apparatus 100 includes the first sub-pixel SPR with a first lower electrode 2R and the second sub-pixel SPG with a second lower electrode 2G. In such a case, at least part of the organic layer 4 may be continuously arranged between a position on the first lower electrode 2R and a position on the second lower electrode 2G. Here, the expression "continuously arranged" implies that the organic layer is continuously arranged without interruption at the intermediate. Furthermore, the expression "continuously arranged between a position on the first lower electrode 2R and a position on the second lower electrode 2G" implies that the organic layer 4 is continuously arranged from the position on the first lower electrode 2R to the position on the second lower electrode 2G without interruption.

Assume further that each of the pixels PX included in the organic light emitting apparatus 100 includes the first sub-pixel SPR with the first lower electrode 2R, the second sub-pixel SPG with the second lower electrode 2G, and the third sub-pixel SPB with a third lower electrode 2B. In such a case, at least part of the organic layer 4 may satisfy the following point. The organic layer 4 may be continuously arranged in at least two of regions between the position on the first lower electrode 2R and the position on the second lower electrode 2G, between the position on the second lower electrode 2G and a position on the third lower electrode 2B, and between the position on the third lower electrode 2B and the position on the first lower electrode 2R. Alternatively, the organic layer 4 may be continuously arranged in all the regions between the position on the first lower electrode 2R and the position on the second lower electrode 2G, between the position on the second lower electrode 2G and the position on the third lower electrode 2B, and between the position on the third lower electrode 2B and the position on the first lower electrode 2R.

The organic layer 4 includes the light emitting layer configured to emit light with recombination of holes supplied from the lower electrode 2 and electrons supplied from the upper electrode 5. The organic layer 4 may include a hole transport layer, the light emitting layer, and an electron transport layer. For the organic layer 4, an appropriate material can be selected from the viewpoint of emission efficiency, a drive lifetime, and optical interference. The hole transport layer may function as an electron blocking layer or a hole injection layer, or may be formed in a layered structure of, for example, the hole injection layer, the hole transport layer, and the electron blocking layer. The light emitting layer may be formed in a layered structure of light emitting layers configured to emit lights of different colors or may be a mixture layer prepared by mixing light emitting dopants that emit lights of different colors. The light emitting layer may contain a first-color light emitting material that emits the light of the first color, a second-color light emitting material that emits the light of the second color, and a third-color light emitting material that emits the light of the third color. The light emitting layer may be configured to produce white light with mixing of individual emission colors. The first color, the second color, and the third color may be, for example, red, green, and blue, respectively. The light emitting layer may contain light emitting materials in a complementary color relation, such as a blue light emitting material and a yellow light emitting material. The electron transport layer may function as a hole blocking layer or an electron injection layer, or may be formed in a layered structure of, for example, the electron injection layer, the electron transport layer, and the hole blocking layer.

The organic layer 4 may include multiple light emitting layers and an intermediate layer positioned between the functional layers. The organic light emitting apparatus 100 may be a light emitting apparatus of a tandem structure in which the intermediate layer serving as a charge generating layer. The tandem structure may include a charge transport layer, such as a hole transport layer or an electron transport layer, between the charge generating layer and the light emitting layer.

The charge generating layer is a layer that includes an electron donating material and an electron accepting material, and that generates charges. The electron donating material and the electron accepting material are, respectively, a material that donates electrons and a material that accepts those electrons. Thus, because positive and negative charges are generated in the charge generating layer, the positive or negative charges can be supplied to layers positioned above and under the charge generating layer. The electron donating material may be, for example, an alkali metal such as lithium or cesium. As an alternative, the electron donating material may be, for example, lithium fluoride, a lithium complex, cesium carbonate, or a cesium complex. In the latter case, an electron donating ability may be developed by mixing a reducing material, such as aluminum, magnesium, or calcium, together. The electron accepting material may be, for example, an inorganic material such as molybdenum oxide, or an organic material such as [dipyrazino [2,3-f:2',3'-h]quinoxaline-2,3,6,7,10,11-hexacarbonitrile] (HAT-CN). The electron accepting material and the electron donating material may be mixed with each other or laminated one above the other.

The upper electrode 5 is a cathode (negative electrode) and is arranged on the organic layer 4. The upper electrode 5 is continuously formed over the multiple light emitting elements 10 and is shared by those light emitting elements 10. Like the organic layer 4, the upper electrode 5 may be integrally formed over the entirety of the display region 110 where the organic light emitting apparatus 100 displays an image. The upper electrode 5 may be an electrode transmitting at least part of light that has reached a lower surface of the upper electrode 5. The upper electrode 5 may function as a transflective layer with a property of transmitting part of light and reflecting the other part of the light (namely, a transflective property). The upper electrode 5 may be made of, for example, a metal such as magnesium or silver, an alloy containing magnesium or silver as a main ingredient, or an alloy material containing an alkali metal or an alkali earth metal. Alternatively, an oxide conductor, such as ITO, IZO, ZnO, AZO, or IGZO, may be used as the upper electrode 5. The upper electrode 5 may be formed in a layered structure insofar as an appropriate transmittance is obtained.

The protective layer 6 is continuously formed on the upper electrode 5 over the multiple light emitting elements 10 and is shared by those light emitting elements 10. The protective layer 6 may contain an inorganic material with light transparency and low permeability for oxygen and moisture incoming from the outside. The protective layer 6 is also called, for example, a moisture-proof layer or a sealing layer. The protective layer 6 may contain, for example, silicon nitride (SiNx), silicon oxynitride (such as SiON), aluminum oxide (such as $Al_2O_3$), silicon oxide (SiOx), or titanium oxide (such as $TiO_2$). The silicon nitride and the silicon oxynitride may be formed by, for example, a CVD method or a sputtering method. On the other hand, the aluminum oxide, the silicon oxide, and the titanium oxide may be formed by an atom layer deposition (ALD) method. Combinations of materials and manufacturing methods for the protective layer 6 are not limited to the above-mentioned examples, and the protective layer 6 may be manufactured in consideration of the thickness of a layer to be formed, the time required to form the protective layer, and so on. The protective layer 6 may be formed in a single-layer structure or a layered structure insofar as transmitting the light having passed through the upper electrode 5 and ensuring sufficient moisture barrier performance.

The color filter layer 70 is formed on the protective layer 6. As described above, the color filter layer 70 may include the first color filter 7R, the second color filter 7G, and the third color filter 7B. Like the first color filter 7R and the second color filter 7G illustrated in FIG. 2, the color filters 7 included in the color filter layer 70 may be in contact with each other without a gap therebetween. Furthermore, an end portion of the color filter 7 for one color may be arranged to overlap an end portion of the color filter 7 for another color.

The first planarization layer 8 is formed between the protective layer 6 and the color filter layer 70, and the second planarization layer 9 is formed on the color filter layer 70. The first and second planarization layers 8 and 9 are made of, for example, resin.

Inclined Portion of Insulating Layer

The inclined portion of the insulating layer 3 will be described below. As illustrated in FIG. 2, the insulating layer 3 included in the organic light emitting apparatus 100 according to this embodiment has the inclined portion of which inclination angle is different for each of the light emitting elements 10.

As described above, the insulating layer 3 covering the end portion of the lower electrode 2 of one light emitting element 10 (light emitting element A) has at least one top portion between the lower electrodes 2 of the one light emitting element 10 (light emitting element A) and another adjacent light emitting element 10 (light emitting element B).

As illustrated in FIG. 2, the insulating layer 3 covering an end portion of the first lower electrode 2R included in the first sub-pixel SPR has a first end portion 31R given by an end portion of the insulating layer 3 positioned on the first lower electrode 2R (on the first lower electrode). The relevant insulating layer 3 has two top portions between the first sub-pixel SPR and the adjacent second sub-pixel SPG, and one of those two top portions, the one being closest to the first sub-pixel SPR, is called a first top portion 32R. In this case, a portion between the first end portion 31R and the first top portion 32R is called a first portion 33R. The first portion 33R includes an inclined portion that is inclined with a normal direction of the inclined portion extending toward an upper side of a first light emitting region where the first lower electrode 2R and the organic layer 4 are in contact with each other.

Similarly, as illustrated in FIG. 2, the insulating layer 3 covering an end portion of the second lower electrode 2G included in the second sub-pixel SPG has a second end portion 31G given by an end portion of the insulating layer 3 positioned on the second lower electrode 2G (on the second lower electrode). The relevant insulating layer 3 has two top portions between the second sub-pixel SPG and the adjacent first sub-pixel SPR, and one of those two top portions, the one being closest to the second sub-pixel SPG, is called a second top portion 32G. In this case, a portion between the second end portion 31G and the second top portion 32G is called a second portion 33G. The second portion 33G includes an inclined portion that is inclined with a normal direction of the inclined portion extending toward an upper side of a second light emitting region where the second lower electrode 2G and the organic layer 4 are in contact with each other.

Similarly, as illustrated in FIG. 2, the insulating layer 3 covering an end portion of the third lower electrode 2B included in the third sub-pixel SPB has a third end portion 31B given by an end portion of the insulating layer 3 positioned on the third lower electrode 2B (on the third lower electrode). The relevant insulating layer 3 has two top portions between the third sub-pixel SPB and the adjacent second sub-pixel SPG, and one of those two top portions, the one being closest to the third sub-pixel SPB is called a third top portion 32B. In this case, a portion between the third end portion 31B and the third top portion 32B is called a third portion 33B. The third portion 33B includes an inclined portion that is inclined with a normal direction of the inclined portion extending toward an upper side of a third light emitting region where the third lower electrode 2B and the organic layer 4 are in contact with each other.

Increase in Light Extraction Efficiency with Inclined Portion of Insulating Layer As described above, the light emitted from the organic layer 4 is output to the outside after passing through the upper electrode 5 and the color filter 7. Here, the organic layer 4 emits not only light L1 propagating upward, but also light L2 propagating in a direction including a parallel direction to the first surface of the substrate 1, namely propagating in a lateral direction. The light L2 propagating in the lateral direction cannot be taken out to the outside from the light emitting element 10 if the light L2 remains as it is. However, the light L2 can also be taken out to the outside from the light emitting element 10 by reflecting the light L2 at the inclined portion of the insulating layer 3 and changing a propagation direction of the light L2 such that the light propagates upward. Consequently, it is considered that the light extraction efficiency of the organic light emitting apparatus 100 can be increased. From the viewpoint of the light extraction efficiency, the light L2 is totally reflected at the inclined portion of the insulating layer 3.

Let now discuss the case in which the light L2 propagating in the lateral direction from the organic layer 4 is totally reflected at the inclined portion of the insulating layer 3. For simplicity, it is assumed that the light L2 propagates parallel to the first surface of the substrate 1. For simplicity, it is further assumed that the inclined portion of the insulating layer 3 has a slope shape defining a flat slope.

To totally reflect the light at the inclined portion of the insulating layer 3 here, an incidence angle $\theta_i$ [°] of the light incident on the inclined portion is to be set to a critical angle $\theta_c$ [°] or greater. In this case, assuming an angle formed between the slope of the inclined portion and the first surface to be an inclination angle $\theta_j$ [°], the incidence angle $\theta_i$ [°] satisfies $\theta_i = 90° - \theta_j$. Accordingly, the light L2 propagating in the lateral direction from the organic layer 4 can be more easily totally reflected by setting the inclination angle $\theta_j$ to a certain value or smaller (namely, $(90° - \theta_c)$ or smaller) such that the incidence angle $\theta_i$ becomes the critical angle $\theta_c$ or greater. It is considered that, by setting the inclination angle $\theta_j$ to a smaller value, the light extraction efficiency of the organic light emitting apparatus 100 can be further increased. The above discussion is made on the case in which the light is totally reflected at the inclined portion of the insulating layer 3, but the disclosure is not limited to that case. In other words, by setting the inclination angle $\theta_j$ to the certain value or smaller (namely, $(90° - \theta_c)$ or smaller), the light L2 propagating in the lateral direction from the organic layer 4 can be more easily reflected.

However, if the inclination angle $\theta_j$ of the inclined portion of the insulating layer 3 is set to be too small uniformly for all the light emitting elements 10, the following disadvantage arises. The insulating layer 3 is arranged to cover the end portion of the lower electrode 2 and acts to reduce a thickness of the organic layer 4 arranged on the lower electrode 2. This leads to an effect of suppressing a current leak between the adjacent sub-pixels SP. However, if the inclination angle $\theta_j$ of the inclined portion of the insulating layer 3 is set to be too small, the above-mentioned effect is reduced and the current leak between the adjacent sub-pixels SP is more likely occur. If the current leak between the adjacent sub-pixels SP occurs, unintended light emission is caused, color purity is reduced, and a color gamut is narrowed.

Achievement of Both Suppression of Current Leak and Increase in Light Extraction Efficiency As a result of intensively carrying out studies based on the above discussion, the inventors found that, by adjusting the inclination angle $\theta_j$ of the inclined portion of the insulating layer 3 for each sub-pixel SP, the light extraction efficiency can be increased while the current leak between the adjacent sub-pixels SP is suppressed. This point will be described below in detail.

The organic light emitting apparatus 100 according to this embodiment includes the multiple sub-pixels SP or the multiple light emitting elements 10, and the color of light to be taken out to the outside is different for each of the sub-pixels SP. In this embodiment, the organic light emitting apparatus 100 includes the color filter layer 70 and outputs light of a particular color by causing the white light emitted from the organic layer 4 to pass through the color filter 7. Because lights of other colors than that of the light taken out to the outside after passing through the color filter 7 are absorbed by the color filter 7, there are no effects on the light extraction efficiency even if the lights of other colors than that of the light taken out to the outside does not reach the color filter 7. Stated conversely, the light extraction efficiency is increased if a larger amount of the light of the color to be taken out to the outside can be guided to reach the color filter 7 and can be output to the outside. When the color filter 7 is a color conversion layer, the light extraction efficiency can be increased if a larger amount of light of a color to be converted to light of a desired color can be guided to reach the color filter 7 and can be output to the outside.

A refractive index of a substance is different depending on a wavelength of light. Generally, when a substance is transparent in a visible light range, the substance exhibits, in the visible light range, normal dispersion that the refractive index has a greater value at a shorter wavelength of the light. A refractive index $n_1$ of the organic layer 4 and a refractive index $n_2$ of the insulating layer 3 will be discussed below with intent to study the total reflection at the inclined portion of the insulating layer 3. When the insulating layer 3 is made up of multiple layers, the refractive index $n_2$ is given by a refractive index of an uppermost one of the layers forming the insulating layer 3. When the organic layer 4 is made up of multiple layers, the refractive index $n_1$ is given by a refractive index of a lowermost one of the layers forming the organic layer 4. The refractive index can be measured by spectroscopic ellipsometry targeted for materials in the form of thin films. A sample for measuring the refractive index can be prepared by forming a thin film of the target material on a Si substrate.

Materials generally used as the organic layer 4 and the insulating layer 3 constituting the organic light emitting apparatus 100 usually exhibit the above-described normal dispersion in the visible light range. Therefore, assuming a wavelength of the light of the first color to be $\lambda_1$ [nm], a wavelength of the light of the second color to be $\lambda_2$ [nm], and $\lambda_1 > \lambda_2$ to be satisfied, the following formulae (5) and (6) are held. The wavelength $\lambda_1$ of the light of the first color implies a wavelength at which the light of the first color has maximum intensity. The wavelength $\lambda_2$ of the light of the second color implies a wavelength at which the light of the second color has maximum intensity. A wavelength $\lambda_3$ of the light of the third color, described later, implies a wavelength at which the light of the third color has maximum intensity. $\lambda_1$ may be 590 nm or longer and 770 nm or shorter, $\lambda_2$ may be 500 nm or longer and 580 nm or shorter, and $\lambda_3$ may be 430 nm or longer and 490 nm or shorter.

$$n_1 @ \lambda_1 > n_1 @ \lambda_2 \qquad (5)$$

$$n_2 @ \lambda_1 > n_2 @ \lambda_2 \qquad (6)$$

In the formula (5), $n_1 @ \lambda_1$ denotes the refractive index of the organic layer 4 at the wavelength $\lambda_1$, and $n_1 @ \lambda_2$ denotes the refractive index of the organic layer 4 at the wavelength $\lambda_2$. In the formula (6), $n_2 @ \lambda_1$ denotes the refractive index of the insulating layer 3 at the wavelength $\lambda_1$, and $n_2 @ \lambda_2$ denotes the refractive index of the insulating layer 3 at the wavelength $\lambda_2$. The above point is similarly applied to the following description.

The critical angle implies a minimum incidence angle at which the total reflection occurs when light propagates from a region with a greater refractive index to a region with a smaller refractive index. The critical angle $\theta_c$ is determined depending on the refractive index of a material on an incident side and the refractive index of a material on an emergent side. The critical angle $\theta_c$ when light enters the insulating layer 3 from the organic layer 4 is expressed by the following formula (7).

$$\theta_c = \arcsin(n_2/n_1) \qquad (7)$$

In the case of $n_1 < n_2$ in the formula (7), the total reflection does not occur regardless of the incidence angle. In this embodiment, the following formulae (8) and (9) are further to be held. In one embodiment, $n_1 > n_2$ is satisfied over the entire visible light range (400 nm or longer and 700 nm or shorter).

$$n_1 @ \lambda_1 > n_2 @ \lambda_1 \qquad (8)$$

$$n_1 @ \lambda_2 > n_2 @ \lambda_2 \qquad (9)$$

Moreover, the following formula (10) is to be held. The formula (10) implies that wavelength dependency of the refractive index of the insulating layer 3 is smaller than that of the refractive index of the organic layer 4. Such a feature is a general tendency of materials that are usually used as the organic layer 4 and the insulating layer 3 constituting the organic light emitting apparatus 100.

$$(n_1 @ \lambda_1)/(n_2 @ \lambda_1) < (n_1 @ \lambda_2)/(n_2 @ \lambda_2) \qquad (10)$$

The above discussion can be summarized as follows. As seen from the formula (7), the critical angle is determined depending on the refractive index $n_1$ of the organic layer 4 and the refractive index $n_2$ of the insulating layer 3. The refractive index $n_1$ of the organic layer 4 and the refractive index $n_2$ of the insulating layer 3 are different depending on wavelength, and the critical angle $\theta_c$ has a greater value at a longer wavelength. Thus, the following formula (11) is held. In the formula (11), $\theta_c @ \lambda_1$ denotes the critical angle at the wavelength $\lambda_1$, and $\theta_c @ \lambda_2$ denotes the critical angle at the wavelength $\lambda_2$.

$$\theta_c @ \lambda_1 > \theta_c @ \lambda_2 \qquad (11)$$

As described above, the light L2 propagating in the lateral direction from the organic layer 4 can be more easily reflected or totally reflected by setting the inclination angle $\theta_j$ to the certain value or smaller (namely, (90°−$\theta_c$) or smaller) such that the incidence angle $\theta_i$ becomes the critical angle $\theta_c$ or greater. Because the critical angle $\theta_c$ at the wavelength $\lambda_1$ is greater than the critical angle $\theta_c$ at the wavelength $\lambda_2$ as seen from the formula (11), an upper limit of the inclination angle $\theta_j$ is smaller at the wavelength $\lambda_1$ than at the wavelength $\lambda_2$. Thus, the upper limit of the inclination angle $\theta_j$ required to reflect or totally reflect the light at the inclined portion of the insulating layer 3 and to increase the light extraction efficiency is smaller for the sub-pixel SP from which light with a longer wavelength is to be taken out to the outside. In other words, the inclined portion of the insulating layer 3 does not need to be so gentle for the sub-pixel SP from which light with a shorter wavelength is to be taken out to the outside.

Relation Among Inclination Angles in Sub-Pixels SP

The inclination angle of the inclined portion of the insulating layer 3 in each of the sub-pixels SP included in the organic light emitting apparatus 100 according to this embodiment, designed on the basis of the above-described technical concept, will be described below. Each of the pixels PX includes the three kinds of sub-pixels SP, namely the first sub-pixel SPR emitting the light of the first color, the second sub-pixel SPG emitting the light of the second color, and the third sub-pixel SPB emitting the light of the third color. Here, assuming the wavelength at which the light of the first color has the maximum intensity to be $\lambda_1$, the wavelength at which the light of the second color has the maximum intensity to be $\lambda_2$, and the wavelength at which the light of the third color has the maximum intensity to be $\lambda_3$, the following formulae (3) and (1) are satisfied.

$$\lambda_1 > \lambda_2 \tag{3}$$

$$\lambda_1 > \lambda_2 > \lambda_3 \tag{1}$$

As described above, the first color, the second color, and the third color may be red, green, and blue, respectively. Thus, $\lambda_1$ may be 610 nm, $\lambda_2$ may be 515 nm, and $\lambda_3$ may be 450 nm.

As described above, the inclination angle of the inclined portion of the insulating layer 3 does not need to be so small for the sub-pixel SP from which the light with a shorter wavelength is to be taken out to the outside. To suppress the current leak between the adjacent sub-pixels SP, therefore, the inclination angle of the inclined portion of the insulating layer 3 in the sub-pixel SP from which the light with the shorter wavelength is to be taken out to the outside is designed to be greater than that in the sub-pixel SP from which the light with the longer wavelength is to be taken out to the outside. Assuming the inclination angle of the first portion 33R of the insulating layer 3 in the first sub-pixel SPR to be $\theta_1$, the inclination angle of the second portion 33G of the insulating layer 3 in the second sub-pixel SPG to be $\theta_2$, and the inclination angle of the third portion 33B of the insulating layer 3 in the third sub-pixel SPB to be $\theta_3$, the following formulae (4) and (2) are satisfied. The inclination angles $\theta_1$, $\theta_2$, and $\theta_3$ are each an inclination angle relative to the upper surface (first surface) of the substrate 1.

$$\theta_1 < \theta_2 \tag{4}$$

$$\theta_1 < \theta_2 < \theta_3 \tag{2}$$

Under the above-described conditions, the current leak between the adjacent sub-pixels SP can be suppressed and, at the same time, the light extraction efficiency can be increased in comparison with the case of uniformly reducing the inclination angle.

Definition of Inclination Angle

Definition of the inclination angle is explained taking the second sub-pixel SPG as an example.

Look at a cross-section obtained by cutting each sub-pixel SP along a plane vertical to the substrate 1, as illustrated in FIGS. 1 and 2. FIG. 3 is an enlarged view of FIG. 2.

Figure 3:
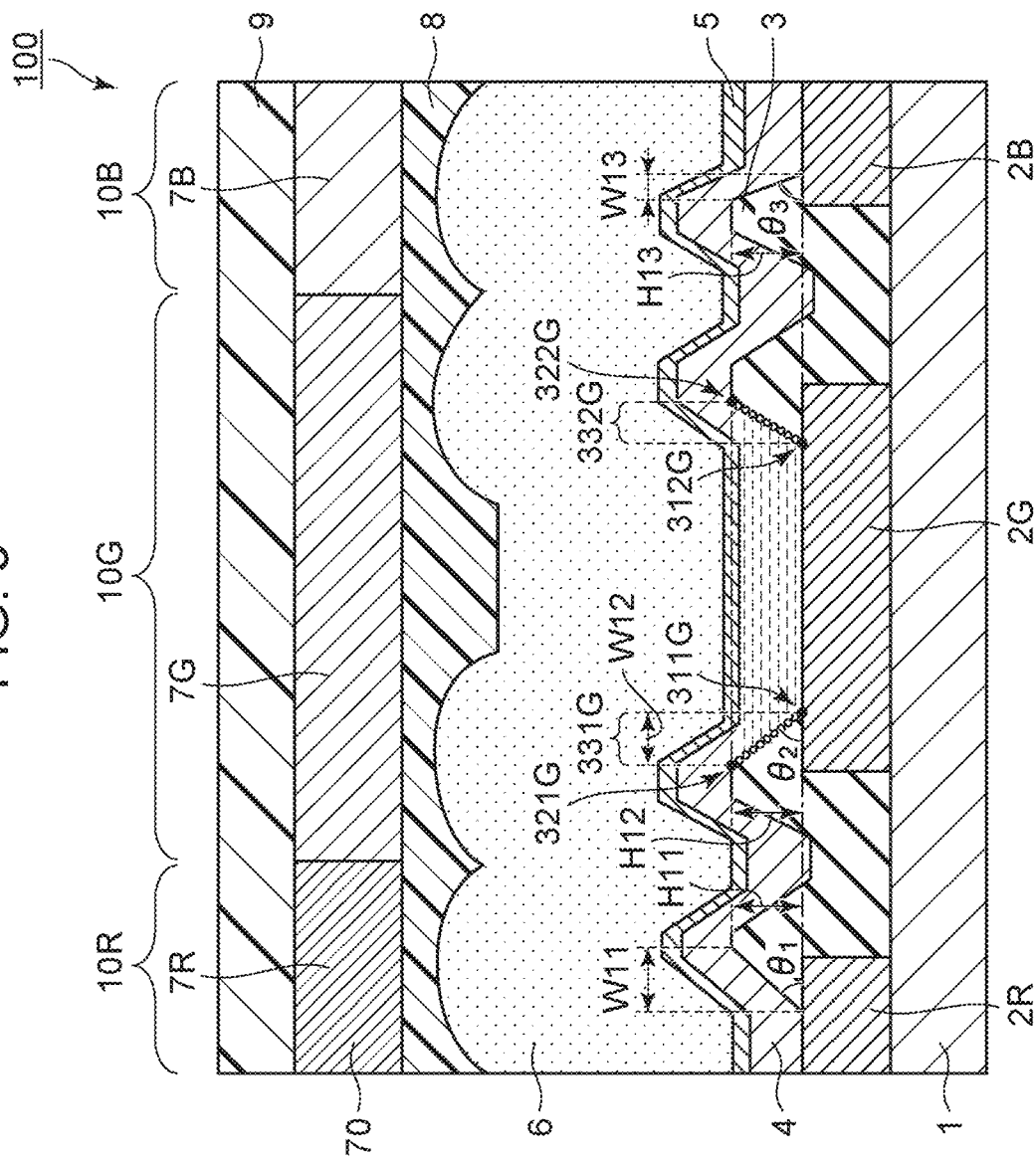
FIG. 3 is a partial enlarged view of FIG. 2.

As illustrated in FIG. 3, the insulating layer 3 covering the end portion of the second lower electrode 2G included in the second sub-pixel SPG has the second end portion 31G (311G, 312G) and the second top portion 32G (321G, 322G). The relevant insulating layer 3 further has the second portion 33G (331G, 332G) between the second end portion 31G and the second top portion 32G. Here, the second portion 33G (331G, 332G) includes the inclined portion that is inclined with the normal direction of the inclined portion extending toward the upper side of the second light emitting region where the second lower electrode 2G and the organic layer 4 are in contact with each other. In the following description, the inclined portion inclined with its normal direction extending toward the upper side of the light emitting region is also called an effective inclined portion. In this embodiment, the entirety of the second portion 33G is the effective inclined portion.

In this Specification, the inclination angle of the second portion 33G is calculated as follows. The inclination angles of the first portion 33R and the third portion 33B can also be calculated in a similar manner.

In the sectional view of FIG. 3, first, straight lines are drawn to divide the portion between the second end portion 31G and the second top portion 32G into ten equal zones in a height direction, namely in a direction vertical to the first surface of the substrate 1. When the second top portion 32G includes a flat portion, straight lines are drawn to divide a portion between part of the flat portion closest to the second end portion 31G and the second end portion 31G into ten equal zones in the direction vertical to the first surface of the substrate 1. In other words, when the second top portion 32G includes the flat portion, the portion between the part of the flat portion closest to the second end portion 31G and the second end portion 31G is given as the second portion 33G. The above point is similarly applied to the first portion 33R and the third portion 33B as well. Angles formed between the insulating layer 3 and the first surface are measured at nine points (denoted by voided circles in FIG. 3) at which the insulating layer 3 intersects nine ones of the eleven straight lines, except for an uppermost straight line (straight line farthest away from the substrate 1) and a lowermost straight line (straight line closest to the substrate 1). The angle formed between the insulating layer 3 and the first surface may be an angle formed between the insulating layer 3 and a plane parallel to the first surface. An average value of the measured nine angles is calculated and is obtained as the inclination angle of the inclined portion of the insulating layer 3.

Shape of Inclined Portion of Each Sub-Pixel SP

The shape of the inclined portion of the insulating layer 3 in each of the sub-pixels SP included in the organic light emitting apparatus 100 according to this embodiment is further described below with reference to FIG. 3. While the relation among the inclination angles in the sub-pixels SP have been described above, the following description is made with attention focused on the shape of the inclined portion.

It is assumed, as illustrated in FIG. 3, that the first portion 33R has a width W11 and a height H11, the second portion 33G has a width W12 and a height H12, and the third portion 33B has a width W13 and a height H13. Here, the width W11 of the first portion 33R is a distance between the first end portion 31R and the first top portion 32R in the direction parallel to the first surface of the substrate 1. The height H11 of the first portion 33R is a height of the first top portion 32R relative to a lower end of the first end portion 31R. Similarly, the width W12 of the second portion 33G is a distance between the second end portion 31G and the second top portion 32G in the direction parallel to the first surface of the substrate 1. The height H12 of the second portion 33G is a height of the second top portion 32G relative to a lower end of the second end portion 31G. The width W13 of the third portion 33B is a distance between the third end portion 31B and the third top portion 32B in the direction parallel to the first surface of the substrate 1. The height H13 of the third portion 33B is a height of the third top portion 32B relative to a lower end of the third end portion 31B.

On the above assumptions, the organic light emitting apparatus 100 satisfies the following formulae (12) and (13).

$$(H11/W11) < (H12/W12) \quad (12)$$

$$(H11/W11) < (H12/W12) < (H13/W13) \quad (13)$$

In one embodiment, the width W11 of the first portion 33R, the width W12 of the second portion 33G, and the width W13 of the third portion 33B are to be substantially equal. The expression "substantially equal" implies that those widths are equal except for manufacturing errors.

In one embodiment, the first portion 33R overlaps the color filter 7R in a plan view looking at the substrate 1. The second portion 33G overlaps the color filter 7G in the plan view looking at the substrate 1. The third portion 33B overlaps the color filter 7B in the plan view looking at the substrate 1. With the effective inclined portion overlapping the corresponding color filter 7 in the plan view as described above, the light reflected or totally reflected at the inclined portion of the insulating layer 3 can be more easily guided toward the color filter 7. As a result, it is possible to increase the emission efficiency for the desired color and to improve both the emission efficiency and the color gamut.

The organic light emitting apparatus 100 has been described above as satisfying both the formulae (4) and (2). However, the disclosure is not limited to that case, and the organic light emitting apparatus 100 may satisfy only the formula (4) without satisfying the formula (2). For example, an organic light emitting apparatus satisfying the formula (4) and set to $\theta_2=\theta_3$ also falls within the scope of the disclosure. Similarly, the organic light emitting apparatus 100 has been described above as satisfying both the formulae (12) and (13). However, the disclosure is not limited to that case, and the organic light emitting apparatus 100 may satisfy only the formula (12) without satisfying the formula (13). For example, an organic light emitting apparatus satisfying the formula (12) and set to (H12/W12)=(H13/W13) also falls within the scope of the disclosure.

Second Embodiment

An organic light emitting apparatus according to a second embodiment of the disclosure will be described below with reference to FIG. 4. The following description is made mainly about a different point from the first embodiment.

Figure 4:
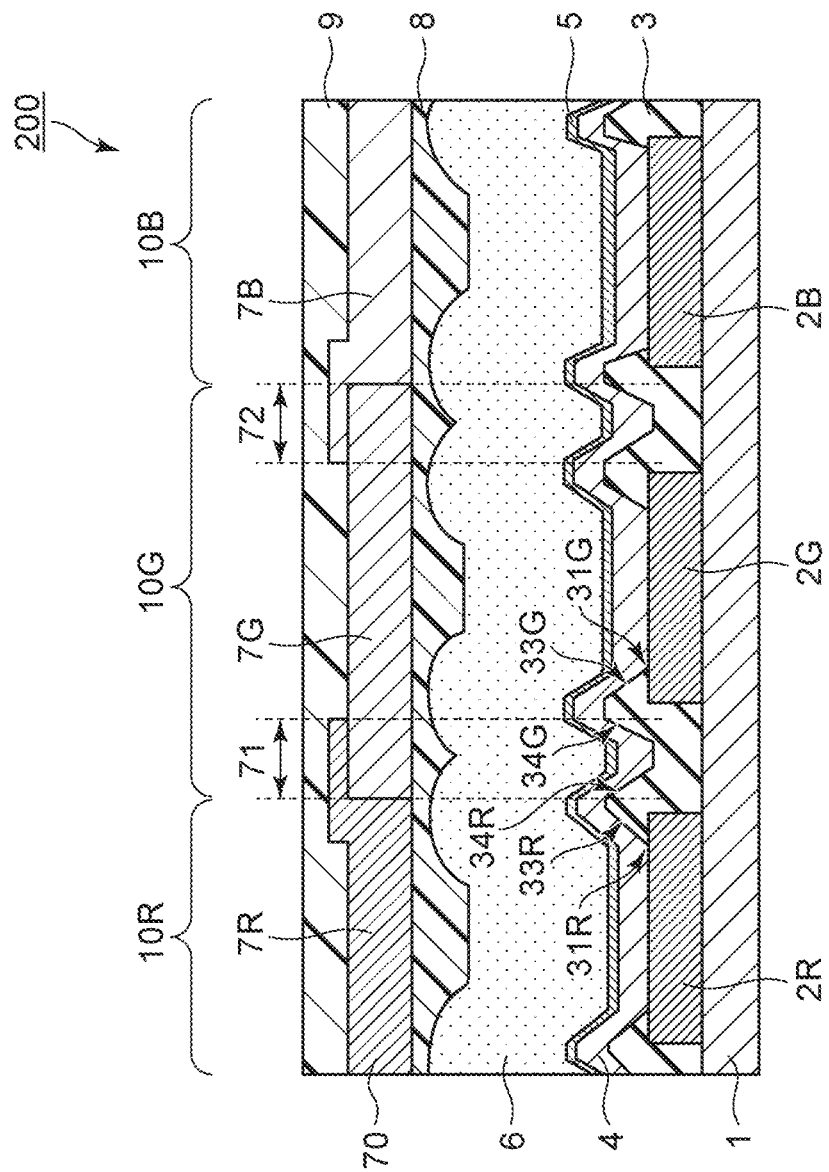
FIG. 4 is a sectional view illustrating a configuration of an organic light emitting apparatus according to a second embodiment.

FIG. 4 is a sectional view illustrating a configuration of the organic light emitting apparatus 200 according to the second embodiment. The organic light emitting apparatus 200 according to the second embodiment is different from the organic light emitting apparatus 100 according to the first embodiment in that the color filter layer 70 includes a region where the color filters 7 partially overlap each other. The organic light emitting apparatus 200 includes an overlap region 71 where the end portion of the first color filter 7R rides over and overlaps the end portion of the second color filter 7G. The organic light emitting apparatus 200 further includes an overlap region 72 where the end portion of the third color filter 7B rides over and overlaps the end portion of the second color filter 7G. If the light emitted from the light emitting element 10 in one certain sub-pixel SP passes through the color filter 7 of the adjacent sub-pixel SP and is taken out to the outside, unintended light emission is caused and the color gamut is narrowed. In this embodiment, the overlap region between the color filters 7 is formed at a location at which the light emitted from the light emitting element 10 in the one certain sub-pixel SP may enter the color filter 7 in the adjacent sub-pixel SP. With the presence of the overlap region, the light can be weakened by the action of the two color filters 7 and hence a reduction of the color gamut can be suppressed.

As illustrated in FIG. 4, the organic light emitting apparatus 200 includes the insulating layer 3, and the insulating layer 3 has two mountains between every adjacent two sub-pixels. For example, when looking at the insulating layer 3 covering both the end portion of the first lower electrode 2R and the end portion of the second lower electrode 2G while following its upper surface from the first end portion 31R on the first lower electrode 2R to the second end portion 31G on the second lower electrode 2G, four inclined portions given below are present in the order mentioned. Namely, there are an inclined portion (effective inclined portion) 33R facing the light emitting region of the first sub-pixel SPR, an inclined portion 34R not facing the light emitting region of the first sub-pixel SPR, an inclined portion 34G not facing the light emitting region of the second sub-pixel SPG, and an inclined portion (effective inclined portion) 33G facing the light emitting region of the second sub-pixel SPG. Of those four inclined portions, the inclined portion 34R and the inclined portion 34G may reflect the light emitted from the adjacent sub-pixel to be incident on the color filter 7 for a different color. In this embodiment, taking into account the above-described point, the inclined portion 34R and the inclined portion 34G are arranged to overlap the above-described overlap region 71 between the adjacent color filters in the plan view. Although the overlap region 71 is illustrated as overlapping both the inclined portion 34R and the inclined portion 34G, the disclosure is not limited to such a case. At least one of the inclined portion 34R and the inclined portion 34G is to overlap the overlap region 71.

In this embodiment, the inclined portion (effective inclined portion) 33R and the inclined portion (effective inclined portion) 33G do not overlap the overlap region 71 between the adjacent color filters 7 in the plan view. With such an arrangement, the light reflected or totally reflected at the effective inclined portion is taken out to the outside of the light emitting element without being blocked by the overlap region 71 between the adjacent color filters 7, and hence the emission efficiency can be increased.

Third Embodiment

An organic light emitting apparatus according to a third embodiment of the disclosure will be described below with reference to FIG. 5. The following description is made mainly about a different point from the second embodiment.

Figure 5:
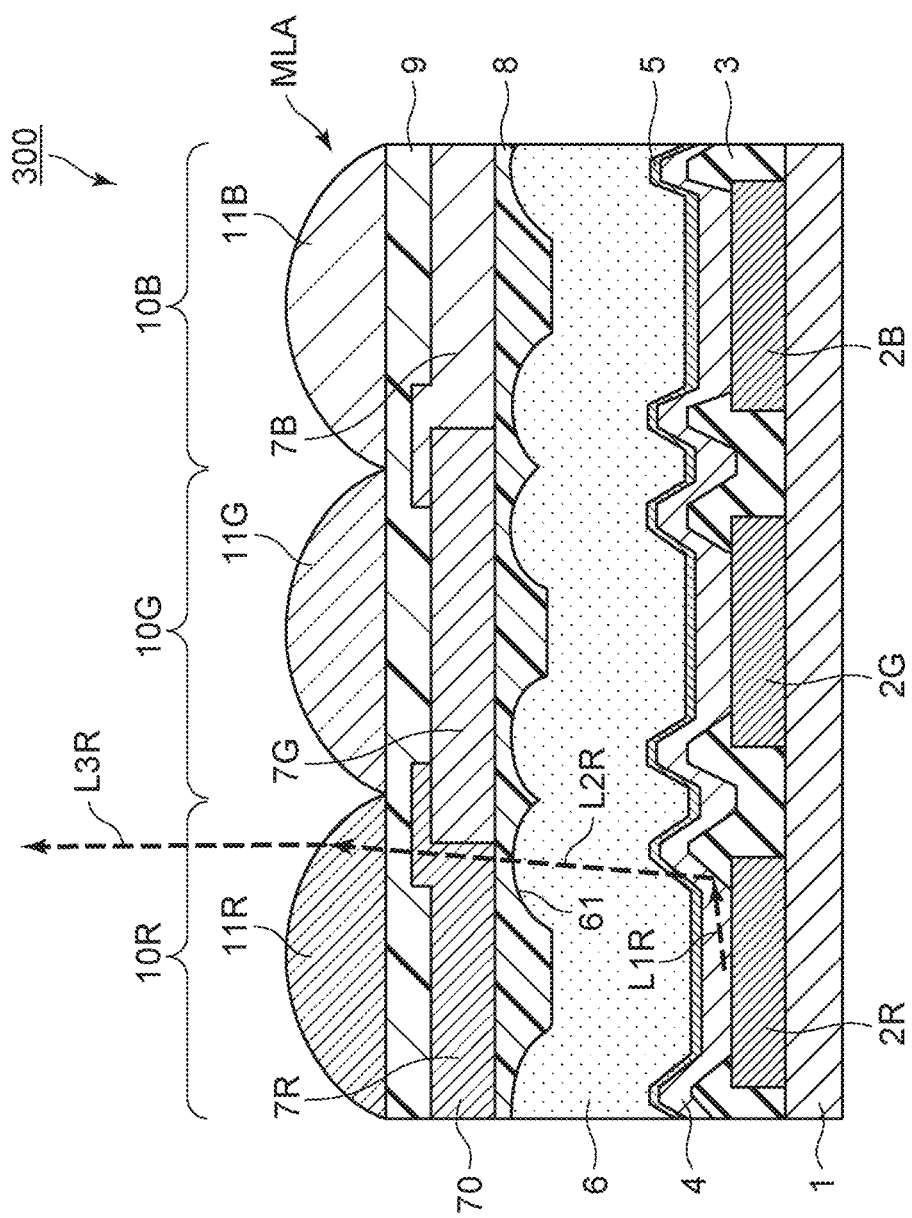
FIG. 5 is a sectional view illustrating a configuration of an organic light emitting apparatus according to a third embodiment.

FIG. 5 is a sectional view illustrating a configuration of the organic light emitting apparatus 300 according to the third embodiment. The organic light emitting apparatus 300 according to the third embodiment includes a microlens array MLA on the second planarization layer 9 in addition to the configuration of the organic light emitting apparatus 200 according to the second embodiment. The microlens array MLA includes a first microlens 11R corresponding to the first light emitting element 10R, a second microlens 11G corresponding to the second light emitting element 10G, and a third microlens 11B corresponding to the third light emitting element 10B. Each of those microlenses 11 is arranged to overlap a center of the light emitting region of the corresponding light emitting element 10 in the plan view. The light emitting region of the corresponding light emitting element 10 is defined by the opening in the insulating layer 3, and the center of the light emitting region may be set to a gravity center of the opening in the insulating layer 3.

Each microlens 11 included in the microlens array MLA has a light condensing effect. The microlens 11 has the function of condensing light incoming from the same side as the color filter 7 and outputting the condensed light from a surface on a side opposite to the color filter 7. Therefore, the light L2R reflected or totally reflected at the inclined portion of the insulating layer 3 can be output as light L3R propagating more closely toward a front direction, and the emission efficiency in the front direction can be further increased.

The microlenses 11 constituting the microlens array MLA may be each a microlens known in the art. A material of the microlens 11 may be resin. The microlens array MLA can be formed, for example, by forming a film (photoresist film) made of the material to be used to form the microlens 11, and then performing exposure and development on the photoresist film by using a mask with a continuous gradation change. A grey mask or an area gradation mask can be used as the above-mentioned mask. Moreover, a lens shape may be adjusted by performing an etch back process on the microlens 11 that has been formed through an exposure and development process. The shape of the microlens 11 is to be able to refract the emitted light, and the lens shape may be spherical or aspherical. A sectional shape of the microlens 11 may be asymmetric.

An emergent surface side of the microlens 11, namely an opposite side of the microlens 11 to the color filter 7, is filled with a material with a lower refractive index than the microlens 11, typically air. Under that condition, the light condensing effect of the microlens 11 can be increased.

The sealing (protective) layer 6 may have a protrusion 61 protruding from an upper surface in a direction away from the substrate 1. The protrusion 61 of the sealing layer 6 also has the light condensing effect as with the microlens 11. In one embodiment, the protrusion 61 of the sealing layer 6 overlaps the effective inclined portion (33R, 33G, 33B) of the insulating layer 3 in the plan view. With such an arrangement, a similar effect to the light condensing effect of the microlens 11 can be expected, and the light reflected or totally reflected at the effective inclined portion of the insulating layer 3 can be more easily taken out toward the front direction.

Fourth Embodiment

An organic light emitting apparatus according to a fourth embodiment of the disclosure will be described below with reference to FIGS. 6 to 8. The following description is made mainly about a different point from the third embodiment.

Figure 6:
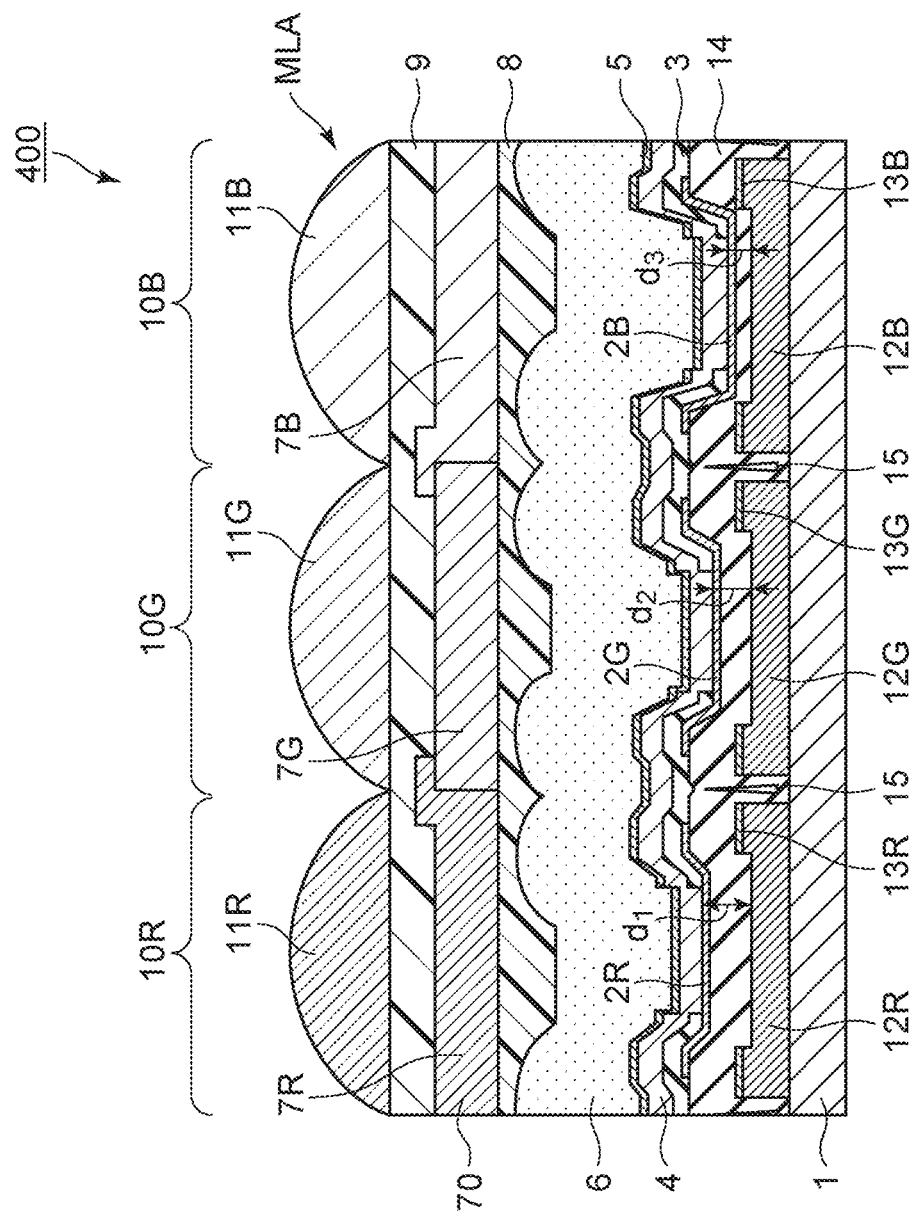
FIG. 6 is a sectional view illustrating a configuration of an organic light emitting apparatus according to a fourth embodiment.

FIG. 6 is a sectional view illustrating a configuration of the organic light emitting apparatus 400 according to the fourth embodiment. The organic light emitting apparatus 400 according to the fourth embodiment includes a reflecting layer 12 and an optical adjustment layer 14 between the substrate 1 and the lower electrode 2 in addition to the configuration of the organic light emitting apparatus 300 according to the third embodiment.

The reflecting layer 12 is a layer reflecting the light generated from the organic layer 4 and propagating toward the substrate 1. The reflecting layer 12 may be separated for each sub-pixel SP. FIG. 6 illustrates an example in which the reflecting layer 12 is separated for each sub-pixel SP. The first sub-pixel SPR includes a first reflecting layer 12R, the second sub-pixel SPG includes the second reflecting layer 12G, and the third sub-pixel SPB includes the third reflecting layer 12B.

From the viewpoint of the emission efficiency of the organic light emitting apparatus 400, a material with a reflectance of 50% or more for visible light may be used as the reflecting layer 12. More specifically, a metal such as Al or Ag, or an alloy obtained by adding, for example, Si, Cu, Ni, Nd or Ti to any of those metals may be used as the reflecting layer 12. The reflecting layer 12 may include a barrier layer formed on its surface reflecting the light. A metal such as Ti, W, Mo or Au, an alloy of any of those metals, or a transparent conductive oxide such as ITO or IZO may be used as a material of the barrier layer on the reflecting layer 12.

The reflecting layer 12 may include a conductive layer 13 on a peripheral region of the reflecting layer 12. The conductive layer 13 is made of, for example, Ti or TiN and may serve as the above-mentioned barrier layer. With the presence of the conductive layer 13 formed on the reflecting layer 12, a resistance can be reduced when the reflecting layer 12 and the lower electrode 2 are electrically connected to each other. For example, each lower electrode 2 may extend up to a position on an opening (contact hole) formed in the insulating layer 3 and may be electrically connected, through the opening, to the conductive layer 13 that is arranged on the peripheral portion of the reflecting layer 12 to be positioned under the opening.

According to this embodiment, since the reflecting layer 12 is formed on the first surface of the substrate 1, a lower surface of the reflecting layer 12 coincides with the first surface. Hence the lower surface of the reflecting layer 12 may be regarded as the first surface.

The optical adjustment layer 14 is a light-transparent insulating layer positioned between the reflecting layer 12 and the lower electrode 2. The optical adjustment layer 14 included in the organic light emitting apparatus 400 is continuously arranged over the multiple sub-pixels SP, but a thickness of the optical adjustment layer 14 is different for each of the sub-pixels SP. Such an arrangement may provide a configuration (resonance structure) of optimizing an optical path length between the reflecting layer 12 and a light emitting position in the light emitting layer of the organic layer 4 for each color.

The optical adjustment layer 14 may be constituted by a single layer or multiple layers. The optical adjustment layer 14 may be constituted by multiple layers, and the number of laminated layers may be different for each sub-pixel SP. A material of the optical adjustment layer 14 is not limited to particular one and, for example, silicon oxide (SiOx) may be used.

The lower electrode 2 is positioned on the optical adjustment layer 14. As described above, the lower electrode 2 is arranged to be electrically separated for each sub-pixel SP. The lower electrode 2 may be made of a transparent material, for example, an oxide conductor such as ITO, IZO, ZnO, AZO, or IGZO. The optical adjustment layer 14 and the lower electrode 2 are each optically transparent.

The optical path length between the upper electrode 5 and the reflecting layer 12 in the organic light emitting apparatus 400 according to this embodiment may be set to provide an enhancing interference structure. The enhancing interference structure can also be called the resonance structure.

By forming the organic layer 4 and the optical adjustment layer 14 to satisfy an enhancing optical interference condition, intensity of the light taken out from the organic light emitting apparatus can be increased with optical interference. By setting an optical condition to enhance the light taken out toward the front direction, the light can be more efficiently emitted toward the front direction. It is also known that a half-value width of an emission spectrum of the light enhanced with the optical interference is reduced in comparison with that of the emission spectrum before the interference. In other words, the color purity can be increased.

In designing the organic light emitting apparatus for light with a wavelength λ, the enhancing interference can be realized by adjusting a distance $d_0$ from the light emitting position in the light emitting layer of the organic layer 4 to a reflecting surface of the reflecting layer 12 to $d_0 = i\lambda/4n_0$ (i=1, 3, 5, ... ).

As a result, a component propagating toward the front direction is increased in a radiation distribution of the light with the wavelength λ, and front brightness is increased. In the above formula, $n_0$ denotes a refractive index of the layer between the light emitting position and the reflecting surface at the wavelength λ.

In this embodiment, to optimize the optical path length from the light emitting position in the light emitting layer of the organic layer 4 to the reflecting layer 12 for each color, an optical path length Lr from the light emitting position in the light emitting layer of the organic layer 4 to the reflecting surface (for example, an upper surface) of the reflecting layer 12 is set to substantially satisfy the following formula (14). The optical path length Lr is a total of the products of refractive indexes $n_j$ and thicknesses $d_j$ of individual layers in the organic layer. Thus, Lr can be expressed by $\Sigma n_j \times d_j$ or $n_0 \times d_0$. In the formula (14), φ denotes a negative value.

$$Lr = (2m - (\phi r/\pi)) \times (\lambda/4) \quad (14)$$

In the above formula (14), m denotes an integer of 0 or more (a non-negative integer), and φr denotes the sum [rad] of phase shifts when the light with the wavelength λ is reflected at the reflecting surfaces. In the case of φr=−π and m=0, Lr=λ/4 is obtained. In the case of φr=−π and m=1, Lr=3λ/4 is obtained. Hereinafter, the condition of m=0 in the above formula (14) is called a λ/4 interference condition, and the condition of m=1 in the above formula (14) is called a 3λ/4 interference condition.

Furthermore, an optical path length Ls between the light emitting position in the light emitting layer of the organic layer 4 and a reflecting surface (for example, a lower surface) of the upper electrode 5 is set to satisfy the following formula (15).

$$Ls = (2m' - (\phi s/\pi)) \times (\lambda/4) = -(\phi s/\pi) \times (\lambda/4) \quad (15)$$

In the above formula (15), m' denotes an integer of 0 or more (a non-negative integer), and φs denotes the sum [rad] of phase shifts when the light with the wavelength λ is reflected at the reflecting surface.

Thus, total layer interference L from the reflecting layer 12 to the upper electrode 5 is set to substantially satisfy the following formula (16).

$$L = (Lr + Ls) = (2m - (\phi/\pi)) \times (\lambda/4) \quad (16)$$

In the above formula (16), φ denotes the sum (φr+φs) of the phase shifts when the light with the wavelength λ is reflected at the reflecting surface 12 and the upper electrode 5.

Taking into consideration a viewing angle characteristic and so on which are in a trade-off relation to the light extraction efficiency in the front direction, the total layer interference L does not need to be exactly matched with a value satisfying the above-described formula in the actual organic light emitting apparatus. More specifically, the total layer interference L may include an error within a numerical range of ±λ/8 from the value satisfying the formula (16). An allowable value within which the value of the total layer interference L may deviate from the interference condition may be 50 nm or more and 75 nm or less.

Thus, in one embodiment, the organic light emitting apparatus 400 according to this embodiment satisfies the following formula (17). Furthermore, the total layer interference L is to fall within a numerical range of ±λ/16 from the value satisfying the formula (16) and satisfies the following formula (17').

$$(\lambda/8) \times (4m - (2\phi/\pi) - 1) < L < (\lambda/8) \times (4m - (2\phi/\pi) + 1) \quad (17)$$

$$(\lambda/16) \times (8m - (4\phi/\pi) - 1) < L < (\lambda/16) \times (8m - (4\phi/\pi) + 1) \quad (17')$$

Here, the emission wavelength λ may be an emission wavelength at which the intensity of the emission light has a maximum peak. In light emission of organic compounds, when an emission spectrum includes multiple peaks, it is general that the intensity of the emission light is maximum at one of those peaks with the shortest wavelength. Therefore, the emission wavelength may be the wavelength at the peak with the shortest wavelength. The emission spectrum indicates an emission spectrum after passing through the color filter (CF) of each light emitting element.

With the above-described arrangement, the light emitted from the organic layer 4 passes through both the lower electrode 2 and the optical adjustment layer 14 and is then reflected at the reflecting layer 12. The light reflected at the reflecting layer 12 enters the inclined portion of the insulating layer 3 at a smaller incidence angle than the light reflected at the lower electrode 2. Assuming the incidence angle of the light reflected at the lower electrode 2 to the inclined portion of the insulating layer 3 to be $\theta_k$ and the incidence angle of the light reflected at the reflecting layer 12 to the inclined portion of the insulating layer 3 to be $\theta_l$, $\theta_k > \theta_l$ is held. It is hence understood that, in the case of forming the reflecting layer 12 and the optical adjustment layer 14 as in this embodiment, the light can be more easily reflected or totally reflected at the inclined portion of the insulating layer 3 than in the case of not forming the reflecting layer 12 and the optical adjustment layer 14 as in the first embodiment. Therefore, the emission efficiency can be further increased by using the enhancing interference structure as in this embodiment.

An example of the organic light emitting apparatus 400 according to this embodiment will be described below.

As illustrated in FIG. 6, in one embodiment, a distance $d_1$ from an upper surface of the first reflecting layer 12R in the first light emitting element 10R to an upper surface of the first lower electrode 2R and a distance $d_2$ from an upper surface of the second reflecting layer 12G in the second light emitting element 10G to an upper surface of the second lower electrode 2G are different from each other. The distance $d_1$ is a shortest distance from the upper surface of the first reflecting layer 12R in the first light emitting element 10R to the upper surface of the first lower electrode 2R. The distance $d_2$ is a shortest distance from the upper surface of the second reflecting layer 12G in the second light emitting element 10G to the upper surface of the second lower electrode 2G. Furthermore, the distance $d_1$, the distance $d_2$, and a distance $d_3$ from an upper surface of the third reflecting layer 12B in the third light emitting element 10B to an upper surface of the third lower electrode 2B are all different from one another. The distance $d_3$ is a shortest distance from the upper surface of the third reflecting layer 12B in the third light emitting element 10B to the upper surface of the third lower electrode 2B. Under the above-described conditions, the effect of improving the emission efficiency with the reflection or the total reflection can be increased.

Moreover, as illustrated in FIG. 6, the distances $d_1$ to $d_3$ satisfy the following formula (18) or (19).

$$d_1 > d_2 \tag{18}$$

$$d_1 > d_2 > d_3 \tag{19}$$

As discussed above, the light reflected at a position farther away from the insulating layer 3 enters the inclined portion of the insulating layer 3 at a larger incidence angle. Accordingly, with the setting to satisfy the above formula (18) or (19), it is possible to increase the incidence angle upon the inclined portion of the insulating layer 3 for the light emitting element 10 that is less apt to reflect or totally reflect the incident light, namely that has a greater critical angle $\theta_c$, thus enabling the relevant light emitting element to more easily reflect or totally reflect the incident light. As a result, the effect of improving the emission efficiency can be further developed while the current leak between the sub-pixels is suppressed.

Figure 7:
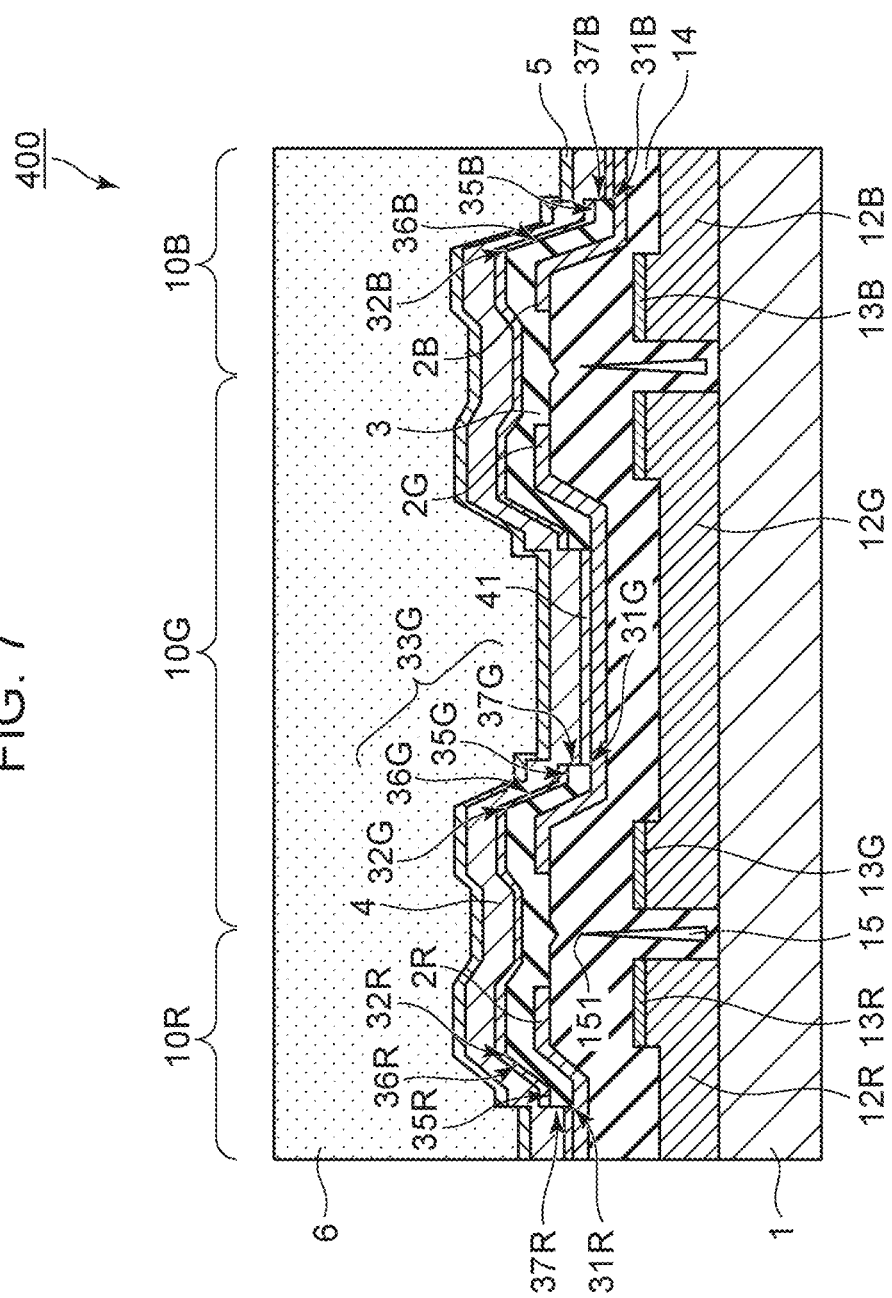
FIG. 7 is a partial enlarged view of FIG. 6.
Figure 8:
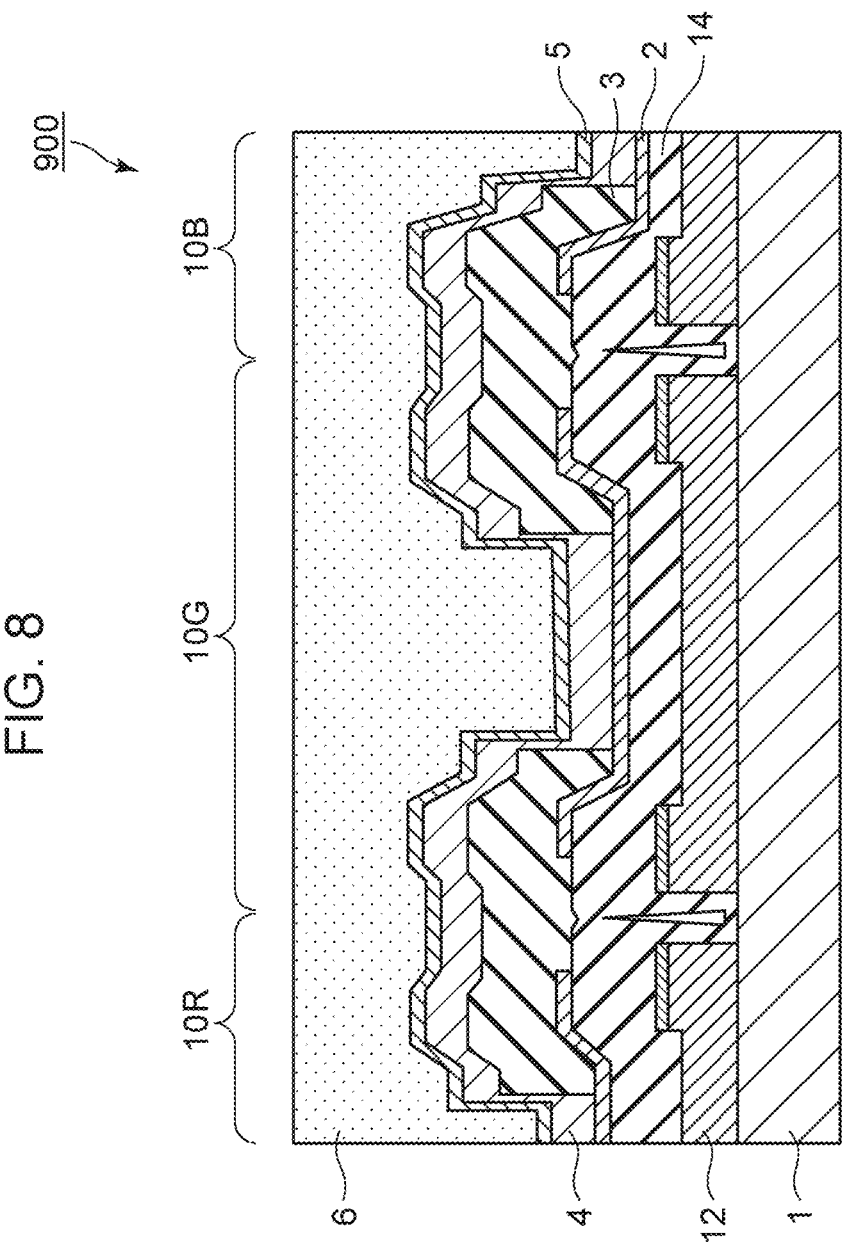
FIG. 8 is a sectional view illustrating a configuration of an organic light emitting apparatus of a comparative example.

As illustrated in FIG. 7, the organic light emitting apparatus 400 according to this embodiment includes a second flat portion 35G substantially parallel to the substrate 1 between the second end portion 31G and the second top portion 32G. The organic light emitting apparatus 400 further includes a second upper inclined portion 36G between the second flat portion 35G and the second top portion 32G, and a second lower inclined portion 37G between the second flat portion 35G and the second end portion 31G. In other words, the second portion 33G is made up of the second flat portion 35G, the second upper inclined portion 36G, and the second lower inclined portion 37G. While the above description is made with attention focused on the second light emitting element 10G in the second sub-pixel SPG, it is similarly applied to the other sub-pixels SP. Thus, looking at the first sub-pixel SPR, the first portion 33R is made up of a first flat portion 35R, a first upper inclined portion 36R, and a first lower inclined portion 37R. Looking at the third sub-pixel SPB, the third portion 33B is made up of a third flat portion 35B, a third upper inclined portion 36B, and a third lower inclined portion 37B.

The lower inclined portion 37 is an inclined portion of which steepest region has a greater inclination angle than the upper inclined portion 36. In one embodiment, a length H3 of the lower inclined portion 37 in the height direction is shorter than a length H2 of the upper inclined portion 36 in the height direction.

As described above, as the inclination angle $\theta_j$ of the inclined portion of the insulating layer 3 is reduced, the light extraction efficiency of the organic light emitting apparatus can be increased. However, if the inclination angle $\theta_j$ is reduced excessively, the current leak between the adjacent sub-pixels SP is more likely to occur. In this embodiment, to cope with the above issue, the inclined portion of the insulating layer 3 includes not only the upper inclined portion 36 with the function of causing the light to be more easily reflected or totally reflected and increasing the light extraction efficiency, but also the lower inclined portion 37 with the function of providing a steeper inclined portion and suppressing the current leak between the sub-pixels SP. As a result, it is possible to realize both the increase in the light extraction efficiency due to the reflection or the total reflection at the inclined portion of the insulating layer 3 and the suppression of the current leak between the adjacent sub-pixels SP at the same time.

Because the lower inclined portion 37 has a steeper inclination than the upper inclined portion 36, a thickness of the organic layer 4 formed on the lower inclined portion 37 can be reduced. Particularly, by reducing a thickness of a charge transport layer 41 that is one of multiple layers constituting the organic layer 4 and that is positioned on a side closer to the lower electrode 2, a charge crosstalk (namely, the current leak) between the sub-pixels SP through the charge transport layer 41 with high conductivity can be suppressed. Thus, the lower inclined portion 37 has the role of suppressing the charge crosstalk between the sub-pixels SP with the steeper inclination. However, if the length of the lower inclined portion 37 with the steeper inclination in the height direction is too long, as illustrated in FIG. 8, a film thickness of the organic layer 4 becomes too thin in some place, and a current leak between the upper electrode 5 and the lower electrode 2 is more likely occur. In this embodiment, to cope with the above issue, the length H3 of the lower inclined portion 37 with the steeper inclination in the height direction is set to be shorter than the length H2 of the upper inclined portion 38 in the height direction. As a result, the current leak between the upper electrode 5 and the lower electrode 2 can be suppressed while the charge crosstalk between the sub-pixels SP is suppressed.

On the other hand, the upper inclined portion 36 has the role of reflecting or totally reflecting the light with a smaller inclination angle and increasing the light extraction efficiency. This effect can be enhanced by increasing the size of a region where the light is reflected or totally reflected. For that reason, in one embodiment, the length H2 of the upper inclined portion 36 in the height direction is longer and the inclination angle of the upper inclined portion 36 is smaller from the viewpoint of enhancing the effect of increasing the light extraction efficiency.

In one embodiment, the length H3 of the lower inclined portion 37 in the height direction is longer than a length (thickness) T1 of the charge transport layer 41 (typically, a hole transport layer) in the height direction in its portion contacting the lower electrode 2. Under such a condition, the charge transport layer 41 can be easily made thinner along the lower inclined portion 37. As a result, the charge crosstalk between the sub-pixels SP can be suppressed.

Furthermore, in another embodiment, the length H3 of the lower inclined portion 37 in the height direction is shorter than a length (thickness) T2 of the organic layer 4 in the height direction in its portion contacting the lower electrode 2. Under such a condition, because part of the organic layer 4 positioned along the lower inclined portion 37 is buried in part of the organic layer 4 formed in a region parallel to the substrate 1, a region where the organic layer 4 becomes too thin is less likely to occur. As a result, the current leak between the upper electrode 5 and the lower electrode 2 can be suppressed.

The features of the disclosure can also be expressed as follows. Assume, as illustrated in FIG. 7, that a height of the first top portion 32R relative to an upper surface of the first flat portion 35R is H21, and that a distance between an end of the first flat portion 35R on a side closer to the first top portion 32R (on a first top portion side) and the first top portion 32R in the direction parallel to the substrate 1 is W21. Furthermore, assume that a height of the second top portion 32G relative to an upper surface of the second flat portion 35G is H22, and that a distance between an end of the second flat portion 35G on a side closer to the second top portion 32G (on a second top portion side) and the second top portion 32G in the direction parallel to the substrate 1 is W22. Moreover, assume that a height of the third top portion 32B relative to an upper surface of the third flat portion 35B is H23, and that a distance between an end of the third flat portion 35B on a side closer to the third top portion 32B (on a third top portion side) and the third top portion 32B in the direction parallel to the substrate 1 is W23.

On the above assumption, the organic light emitting apparatus 400 satisfies the following formulae (20) and (21).

$$(H21/W21) < (H22/W22) \quad (20)$$

$$(H21/W21) < (H22/W22) < (H23/W23) \quad (21)$$

In one embodiment, the distance W21, the distance W22, and the distance W23 are substantially equal. Here, the expression "substantially equal" implies that those distances are equal except for manufacturing errors. When each of the first portion 33R, the second portion 33G, and the third portion 33B includes multiple flat portions, one of those flat portions closest to the top portion 32 may be regarded as the flat portion 35.

The optical adjustment layer 14 is arranged between the reflecting layers 12. On that occasion, in one embodiment, the optical adjustment layer 14 arranged between the reflecting layers 12 has a gap 15 filled with a substance of which refractive index is lower than that of a substance forming the optical adjustment layer 14. The gap 15 may be a vacuum or air space. In such a case, the light extraction efficiency can be further increased due to an effect of reflection or total reflection caused by the gap 15. In other words, the optical adjustment layer 14 arranged between the reflecting layers 12 may include a lower-density region with a smaller density than the optical adjustment layer 14 arranged on the reflecting layer 12. Here, the term "density" may represent an atomic density [atom/cm$^3$] or a weight density [g/cm$^3$].

The gap 15 may have a sharpened protruded portion 151 when viewed in a cross-section vertical to the first surface of the substrate 1, as illustrated in FIG. 7. The protruded portion 151 may be defined by two straight lines in the above-described cross-section, those two straight lines intersecting at an angle of 45° or smaller. In addition, the protruded portion 151 of the gap 15 may be oriented in a direction in which the light is taken out in the organic light emitting apparatus 400.

The sealing layer 6 may include a lower-density region between the lower electrodes 2 in the two adjacent light emitting elements 10 in the plan view. In such a case, the light emission efficiency can be further increased due to the effect of reflection or total reflection caused by the lower-density region.

In one embodiment, a refractive index of the lower electrode 2 is higher than that of the optical adjustment layer 14 at least at one certain wavelength of visible light. Under such a condition, the light can be reflected or totally reflected at an upper surface of an inclined portion of the optical adjustment layer 14, and the light emission efficiency can be increased. Here, when the optical adjustment layer 14 is made up of multiple layers, the refractive index is given by a refractive index of an uppermost one of the layers forming the optical adjustment layer 14. When the lower electrode 2 is made up of multiple layers, the refractive index is given by a refractive index of a lowermost one of the layers forming the lower electrode 2.

Fifth Embodiment

An organic light emitting apparatus according to a fifth embodiment of the disclosure will be described below with reference to FIG. 9. The following description is made mainly about a different point from the fourth embodiment.

Figure 9:
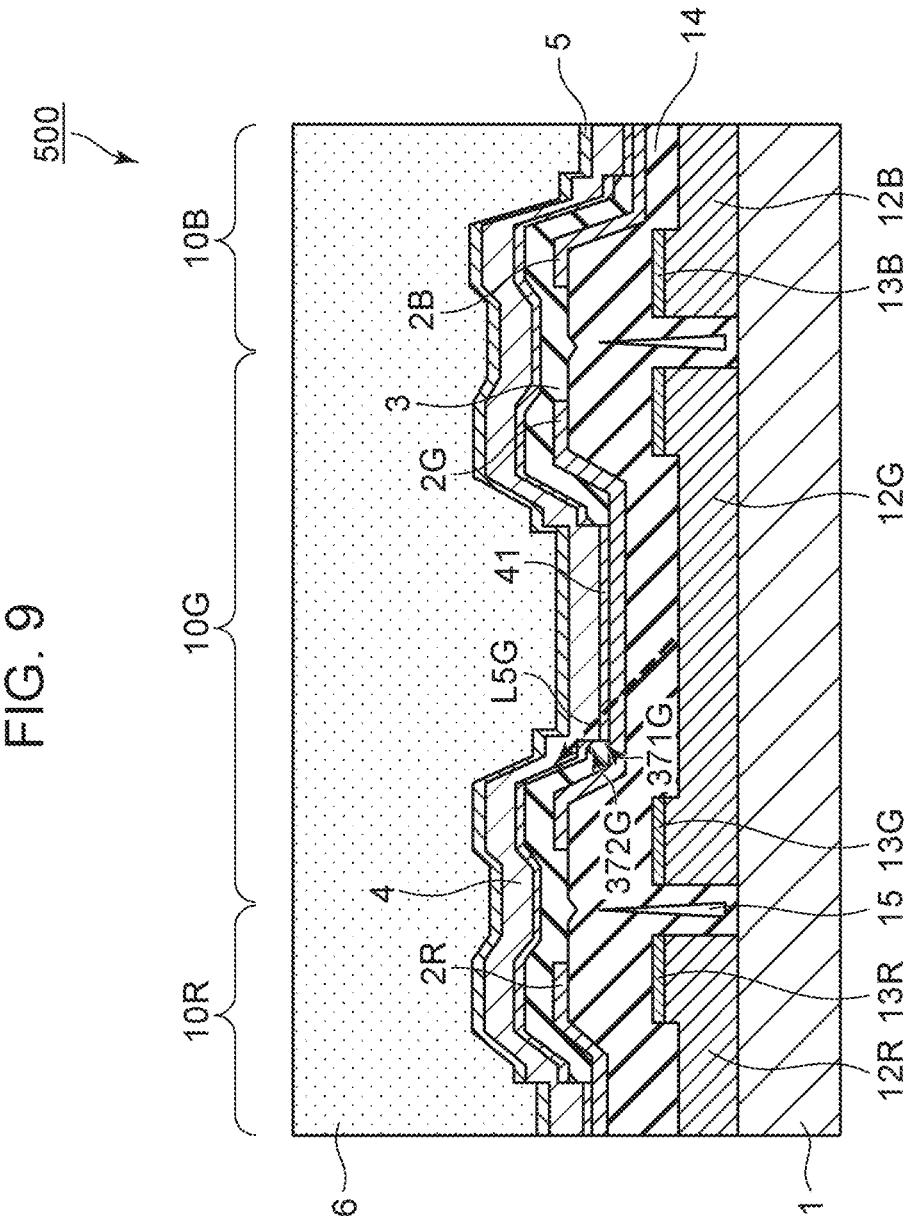
FIG. 9 is a sectional view illustrating a configuration of an organic light emitting apparatus according to a fifth embodiment.

FIG. 9 is a sectional view of the organic light emitting apparatus 500 according to the fifth embodiment. In the organic light emitting apparatus 500, the shape of the lower inclined portion 37 in the organic light emitting apparatus 400 according to the fourth embodiment is changed to a shape that an upper corner of the lower inclined portion 37 is beveled. The lower inclined portion 37 in the organic light emitting apparatus 500 includes a lower gentler inclined portion 372 corresponding to a beveled portion, and a lower steeper inclined portion 371. The lower steeper inclined portion 371 is a portion with a greater inclination angle like the lower inclined portion 37 in the organic light emitting apparatus 400, and the lower gentler inclined portion 372 is a portion with gentler inclination, namely a smaller inclination angle, than the lower steeper inclined portion 371.

With the lower inclined portion 37 including the lower gentler inclined portion 372 as described above, the light L5G reflected at the reflecting layer 12 can more easily reach the upper inclined portion 36 without being blocked by the lower inclined portion 37. As a result, a larger amount of light can be introduced to the upper inclined portion 36, and the light extraction efficiency can be increased.

In one embodiment, a length H4 of the lower steeper inclined portion 371 in the height direction is longer than the length (thickness) T1 of the charge transport layer 41 (typically, the hole transport layer) in the height direction in its portion contacting the lower electrode 2. Under such a condition, the charge transport layer 41 can be easily made thinner along the lower steeper inclined portion 371. As a result, the charge crosstalk between the sub-pixels SP can be suppressed.

Furthermore, in another embodiment, the length H4 of the lower steeper inclined portion 371 in the height direction is shorter than the length (thickness) T2 of the organic layer 4 in the height direction in its portion contacting the lower electrode 2. Under such a condition, because the part of the organic layer 4 positioned along the lower steeper inclined portion 371 is buried in the part of the organic layer 4 formed in the region parallel to the substrate 1, the region where the organic layer 4 becomes too thin is less likely to occur. As a result, the current leak between the upper electrode 5 and the lower electrode 2 can be suppressed.

Other Embodiments

The above embodiments have been described in connection with the configuration that the sub-pixels SPR, SPG, and SPB include the color filters 7R, 7G, and 7B, respectively, and that the first to third lights are emitted by causing the white light generated from the organic layer 4 to pass through the corresponding color filters 7. However, the disclosure is not limited to such a case, and the sub-pixels SP may not need to include the color filters 7. More specifically, another configuration that, in each of the above embodiments, at least the light emitting layer among the multiple layers constituting the organic layer 4 is formed to be separated for each of the sub-pixels also falls within the scope of the disclosure. In that configuration, the first sub-pixel SPR may include a first light emitting layer configured to emit the light of the first color, the second sub-pixel SPG may include a second light emitting layer configured to emit the light of the second color, and the third sub-pixel SPB may include a third light emitting layer configured to emit the light of the third color. At least part of the other layers than the light emitting layer among the multiple layers constituting the organic layer 4 may be arranged in common to the multiple sub-pixels SP. Such an embodiment can also provide the effect of increasing the light extraction efficiency while the current leak between the pixels is suppressed.

Figure 10:
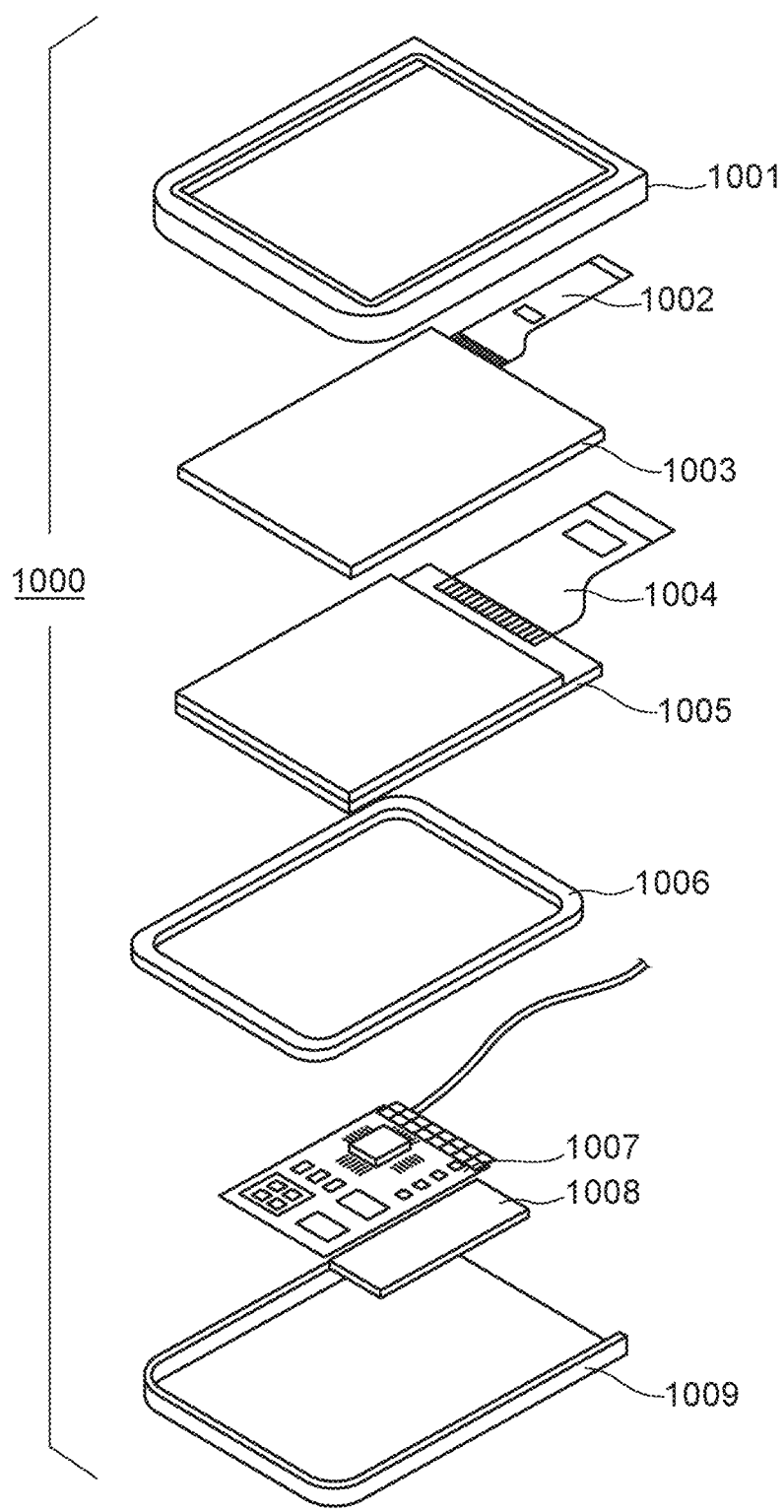
FIG. 10 is a schematic view illustrating an example of a display apparatus.

FIG. 10 is a schematic view illustrating an example of a display apparatus according to an embodiment. A display apparatus 1000 may include, between an upper cover 1001 and a lower cover 1009, a touch panel 1003, a display panel 1005, a frame 1006, a circuit board 1007, and a battery 1008. Flexible printed circuits FPC 1002 and 1004 are connected respectively to the touch panel 1003 and the display panel 1005. Transistors are formed on the circuit board 1007 by printing. The battery 1008 may not need to be included when the display apparatus is not portable, or may be disposed in another location even in the case of a portable apparatus.

The display apparatus according to the embodiment may include color filters of red, green, and blue. Those color filters may be constituted with red, green, and blue colors arranged in the delta array.

The display apparatus according to the embodiment may be used in a display unit of a portable terminal. On that occasion, the display apparatus may have both a display function and an operating function. The portable terminal may be, for example, a mobile phone such as a smartphone, a tablet, or a head mounted display.

The display apparatus according to the embodiment may be used in a display unit of an imaging apparatus including an optical unit equipped with multiple lenses, and an imaging element arranged to receive light having passed through the optical unit. The display unit of the imaging apparatus may be configured to display information obtained by the imaging element. The display unit may be a display unit exposed to the outside of the imaging apparatus, or a display unit disposed in a finder. The imaging apparatus may be a digital camera or a digital video camera.

Figure 11A:
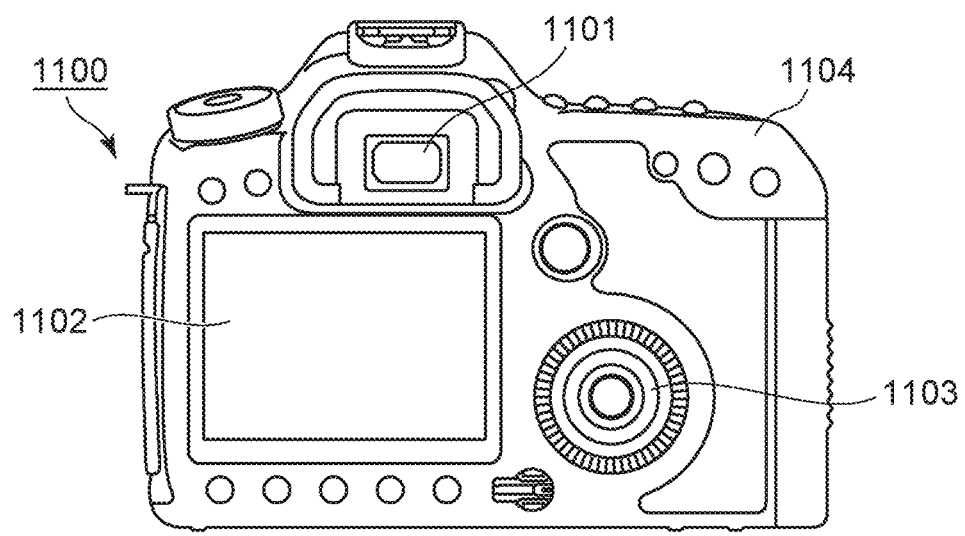
FIGS. 11A and 11B are each a schematic view illustrating an example of an imaging apparatus.

FIG. 11A is a schematic view illustrating an example of an imaging apparatus according to an embodiment. An imaging apparatus 1100 may include a view finder 1101, a back display 1102, an operating unit 1103, and a casing 1104. The viewfinder 1101 may include the display apparatus according to the embodiment. In such a case, the display apparatus may display not only an image to be taken, but also environment information, an image-taking instruction, and so on. The environment information may contain, for example, intensity of extraneous light, a direction of the extraneous light, a moving speed of an object, and a possibility that the object is obstructed by an obstacle.

Because good timing for taking an image is limited to a short period of time, in one embodiment, the information is displayed as soon as possible. The display apparatus using the organic light emitting element according to the disclosure is used from that point of view. This is because the organic light emitting element has a high response speed. The display apparatus using the organic light emitting element can be more suitably used in apparatuses that are demanded to have higher display speeds than a liquid crystal display apparatus.

The imaging apparatus 1100 includes an optical unit (not illustrated). The optical unit includes multiple lenses and focuses an image onto an imaging element disposed in the casing 1104. The lenses can adjust a focal point by adjusting relative positions of the lenses. The focus adjustment can be automated. The imaging apparatus may be also called a photoelectric conversion apparatus. The photoelectric conversion apparatus may adopt, as an imaging method, not only a method of sequentially taking images, but also a method of detecting a difference from a preceding image, a method of extracting part of a recorded image, and so on.

Figure 11B:
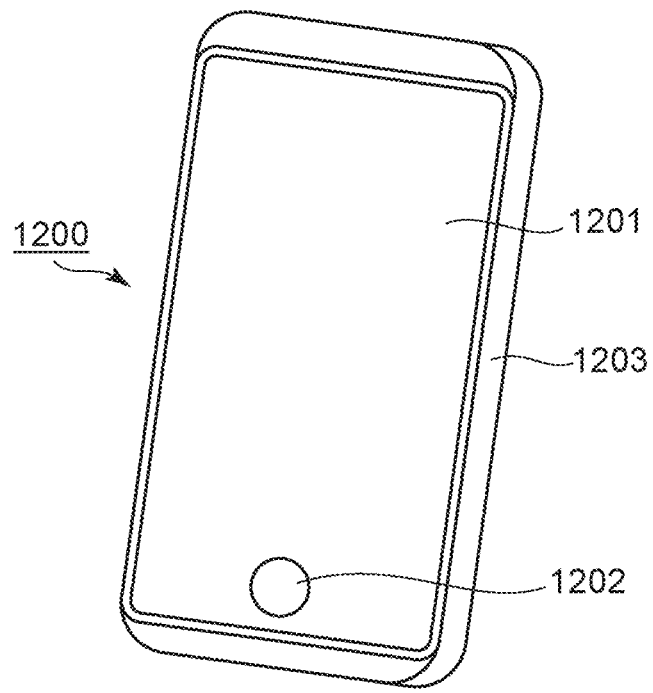

FIG. 11B is a schematic view illustrating an example of electronic equipment according to an embodiment. Electronic equipment 1200 includes a display unit 1201, an operating unit 1202, and a casing 1203. The casing 1203 may accommodate circuits, a printed board on which the circuits are formed, a battery, and a communication unit. The operating unit 1202 may be constituted by buttons or a sensitive unit like a touch panel. The operating unit may be a biometric identification unit, such as a unit of recognizing a fingerprint and unlocking a device. The electronic equipment including the communication unit may also be called communication equipment. The electronic equipment may have a camera function by including a lens and an imaging element. An image taken with the camera function is displayed on the display unit. The electronic equipment may be, for example, a smartphone or a notebook computer.

Figure 12A:
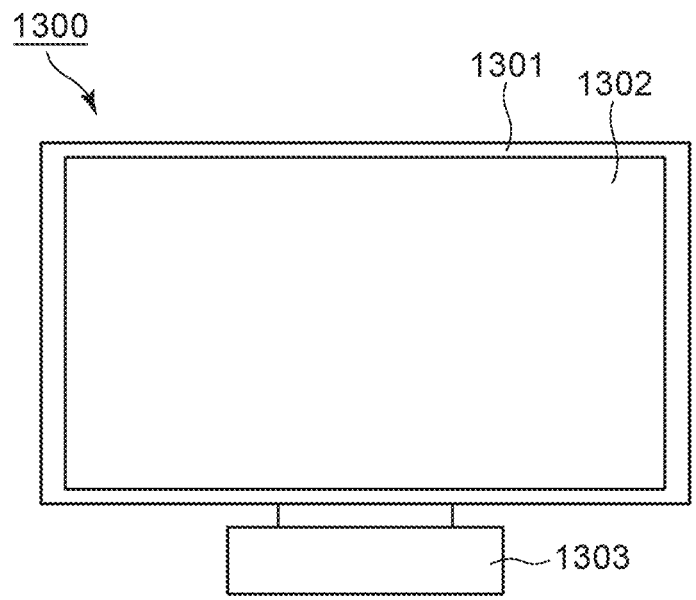
FIGS. 12A and 12B are each a schematic view illustrating another example of the display apparatus.
Figure 12B:
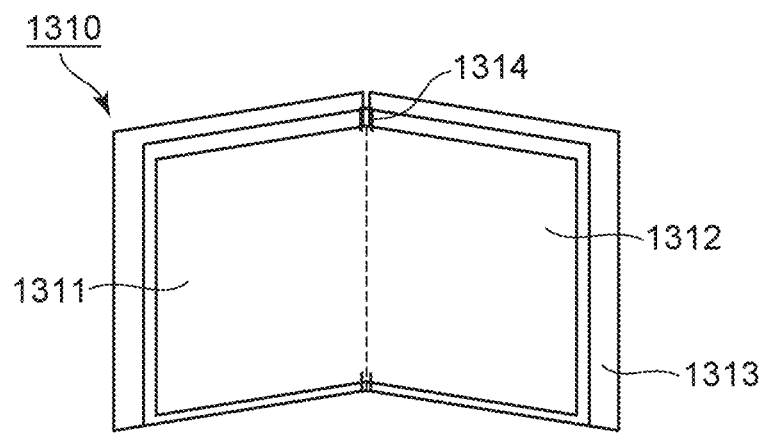

FIGS. 12A and 12B are each a schematic view illustrating another example of the display apparatus according to the embodiment. FIG. 12A represents a display apparatus 1300 such as a TV monitor or a PC monitor. The display apparatus 1300 includes a frame 1301 and a display unit 1302. The light emitting apparatus according to the embodiment may be used as the display unit 1302.

The display apparatus 1300 further includes a base 1303 supporting the frame 1301 and the display unit 1302. The base 1303 is not limited to the form illustrated in FIG. 12A. A lower edge of the frame 1301 may also serve as the base.

The frame 1301 and the display unit 1302 may have a curved shape. The radius of curvature of the curved shape may be 5000 mm or more and 6000 mm or less.

FIG. 12B is a schematic view illustrating still another example of the display apparatus according to the embodiment. A display apparatus 1310 illustrated in FIG. 12B can be folded and is generally called a foldable display apparatus. The display apparatus 1310 includes a first display unit 1311, a second display unit 1312, a casing 1313, and a folding point 1314. Each of the first display unit 1311 and the second display unit 1312 may include the light emitting apparatus according to the embodiment. The first display unit 1311 and the second display unit 1312 may be one unit of display apparatus without a seam. The first display unit 1311 and the second display unit 1312 can be separated from each other at the folding point. The first display unit 1311 and the second display unit 1312 may display different images or may display one image in a combination of both the first and second display units.

Figure 13A:
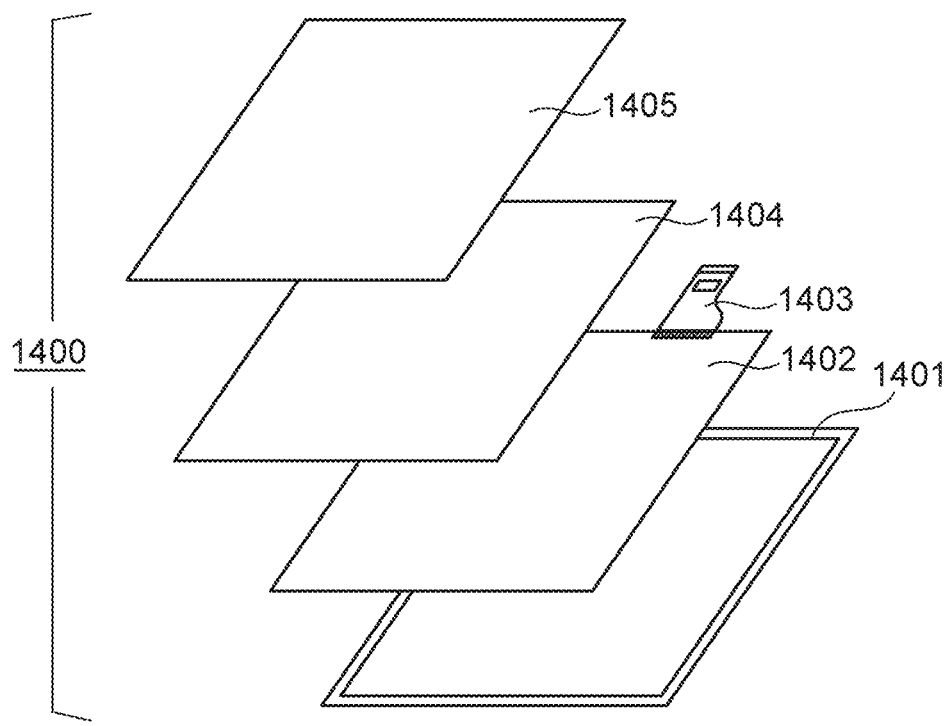
FIGS. 13A and 13B are each a schematic view illustrating an example of an illumination apparatus.

FIG. 13A is a schematic view illustrating an example of an illumination apparatus according to an embodiment. An illumination apparatus 1400 may include a casing 1401, a light source 1402, a circuit board 1403, an optical film 1404, and a light diffuser 1405. The light source 1402 may include the organic light emitting element according to the embodiment. The optical film may be an optical filter for improving a color rendering property of the light source. The light diffuser can effectively diffuse light from the light source as in manner of lighting up an objective, and can cause the light to reach a wider space. The optical filter and the light diffuser may be disposed on a light emergent side of the illumination apparatus. A cover may be disposed on an outermost side as required.

The illumination apparatus illuminates, for example, a room. The illumination apparatus may emit not only white light and neutral white light, but also light of any color in a range from blue to red. The illumination apparatus may include a light control circuit for controlling the emitted light. The illumination apparatus may include the organic light emitting element according to the disclosure and a power supply circuit connected to the organic light emitting element. The power supply circuit is a circuit for converting an AC voltage to a DC voltage. The word "white" implies a color with a color temperature of 4200K, and the word "neutral white" implies a color with a color temperature of 5000K. The illumination apparatus may include a color filter.

The illumination apparatus according to the embodiment may further include a heat dissipation unit. The heat dissipation unit dissipates heat in the apparatus to the outside of the apparatus and may be made of, for example, a metal with a high specific heat, or liquid silicon.

Figure 13B:
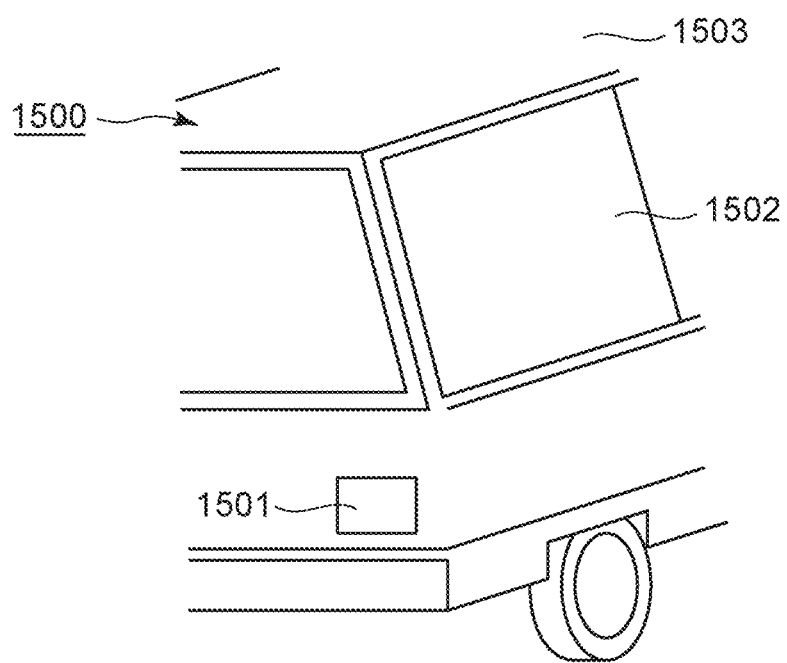

FIG. 13B is a schematic view illustrating a car as an example of a moving object according to an embodiment. The car 1500 includes a tail lamp 1501 as an example of car lightings. The tail lamp 1501 of the car 1500 may be constituted to be lit up, for example, when a brake is operated.

The tail lamp 1501 may include the organic light emitting element according to the embodiment. The tail lamp may include a protective member for protecting the organic light emitting element. The protective member may be made of any suitable material insofar as the material has a certain high level of strength and is transparent. However, in one embodiment, the protective member is made of, for example, polycarbonate. A derivative of frandicarboxylic acid or acrylonitrile, for example, may be added to the polycarbonate.

The car 1500 may include a body 1503 and a window 1502 mounted to the body 1503. The window may be a transparent display on condition that it is not a window through which a driver visually checks the front and the rear of the car. The transparent display may include the organic light emitting element according to the embodiment. In that case, components included in the organic light emitting element, such as electrodes, are formed of transparent members.

The moving object according to the embodiment may be a ship, an airplane, a drone, or the like. The moving object may include a body and a lighting disposed on the body. The lighting may generate light to inform a position of the body. The lighting includes the organic light emitting element according to the embodiment.

Application examples of the above-described display apparatuses according to the embodiments will be described below with reference to FIGS. 14A and 14B. The display apparatus can be applied to a system that can be worn by a user as a wearable device, for example, a smart glass, a HMD, a smart contact lens. An imaging and display apparatus used in such an application example includes an imaging apparatus capable of performing photoelectric conversion of visible light, and a display apparatus capable of emitting visible light.

Figure 14A:
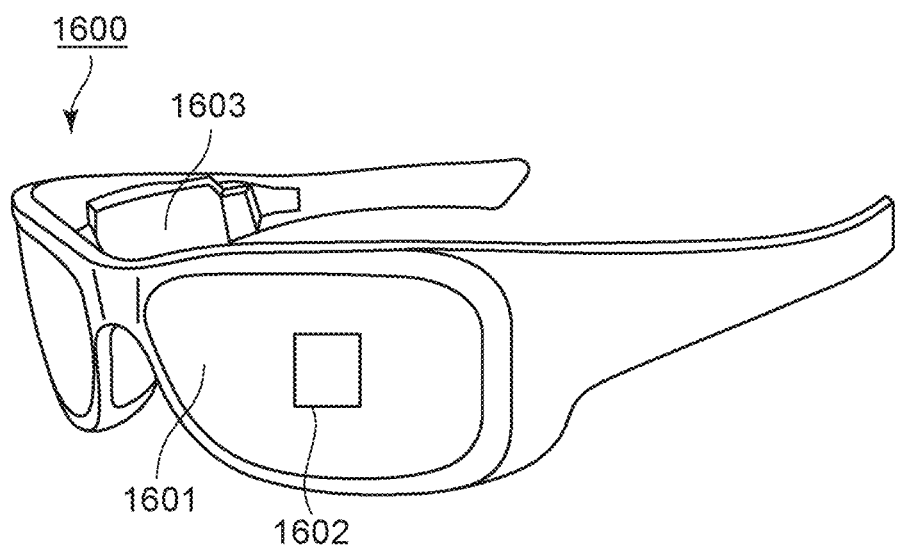
FIGS. 14A and 14B are each a schematic view illustrating an application example of the display apparatus.

FIG. 14A illustrates a pair of eyeglasses 1600 (smart glasses) representing one application example. An imaging apparatus 1602, such as a CMOS sensor or an SPAD, is disposed on a front side of a lens 1601 of each of the eyeglasses 1600. Furthermore, any one of the above-described display apparatuses according to the embodiments is disposed on a rear side of the lens 1601.

The eyeglasses 1600 further include a control device 1603. The control device 1603 functions as a power supply for supplying electric power to the imaging apparatus 1602 and the display apparatus according to the embodiment. In addition, the control device 1603 controls operations of the imaging apparatus 1602 and the display apparatus. An optical system for condensing light to the imaging apparatus 1602 is formed on the lens 1601.

Figure 14B:
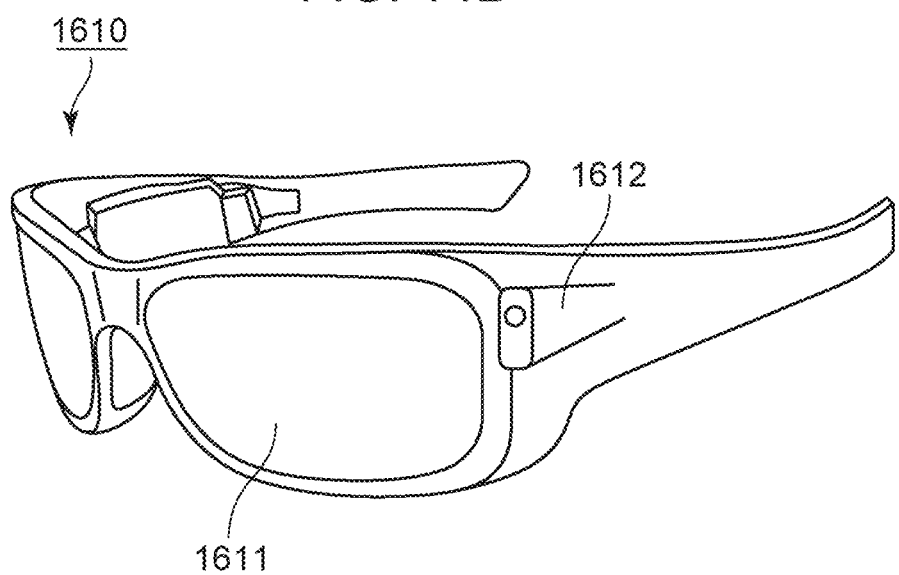

FIG. 14B illustrates a pair of eyeglasses 1610 (smart glasses) representing another application example. The pair of eyeglasses 1610 includes a control device 1612 onto which an imaging apparatus corresponding to the above-mentioned imaging apparatus 1602 and a display apparatus are mounted. Optical systems for condensing light to the imaging apparatus in the control device 1612 and projecting light from the display apparatus are formed on a lens 1611, and an image is projected onto the lens 1611. The control device 1612 functions as a power supply for supplying electric power to the imaging apparatus and the display apparatus, and controls operations of the imaging apparatus and the display apparatus. The control device may include a sight line detector for detecting a sight line of a wearer (user). The sight line may be detected using infrared radiation. An infrared light emitter emits infrared light to an eyeball of the user looking at the displayed image. Reflected light of the emitted infrared light from the eyeball is detected by an imaging unit including a light receiving element, whereby an image of the eyeball is obtained. Deterioration of image quality is reduced with the provision of a unit for reducing the light incident on the display apparatus from the infrared light emitter in a plan view.

The sight line of the user toward the displayed image is detected from the eyeball image taken by the above-described infrared imaging technique. Suitable one of known methods can be optionally applied to detect the sight line from the eyeball image. As an example, a sight line detection method on the basis of a Purkinje image formed by irradiation light reflected at the cornea can be used.

In more detail, a sight line detection process is performed in accordance with a pupil-corneal reflection method. With the pupil-corneal reflection method, a sight line vector representing a direction (rotation angle) of the eyeball is calculated on the basis of a pupil image and a Purkinje image both included in the eyeball image, whereby the sight line of the user is detected.

A display apparatus according to an embodiment of the disclosure may include an imaging apparatus with a light receiving element and may control a displayed image on the display apparatus in accordance with information about the sight line of the user, the information being provided from the imaging apparatus.

More specifically, the display apparatus determines, on the basis of the sight line information, a first visual region at which the user is looking, and a second visual region other than the first visual region. The first visual region and the second visual region may be determined by a control device in the display apparatus, or may be obtained by receiving those visual regions that have been determined by an external control device. In a display region of the display apparatus, a display resolution in the first visual region may be controlled to be higher than that in the second visual region. In other words, the display resolution may be set to be lower in the second visual region than in the first visual region.

Moreover, the display region includes a first display region and a second display region different from the first display region, and one of the first display region and the second display region, the one having higher priority, is determined on the basis of the sight line information. The first display region and the second display region may be determined by the control device in the display apparatus, or may be obtained by receiving those display regions that have been determined by an external control device. A resolution in the region with higher priority may be controlled to be higher than that in the region other than the region with higher priority. In other words, the resolution may be set to be lower in the region with relatively low priority.

AI may be used to determine the first visual region or the region with higher priority. The AI may be a model configured to estimate, from the eyeball image, an angle of the sight line and a distance to an objective in front of the sight line by using, as teacher data, the eyeball image and a direction in which the eyeball in the image is actually looking. An AI program may be installed in any one of the display apparatus, the imaging apparatus, and an external device. When the AI program is installed in the external device, the AI program is transmitted to the display apparatus via communication.

When display control is to be performed in accordance with visual recognition, the disclosure can be applied to a smart glass that further includes an imaging apparatus configured to take an image of an external field. The smart glass can display in real time information obtained by taking the image of the external field.

As described above, display ensuring good image quality and being stable even for a long time can be presented by using the apparatus equipped with the organic light emitting element according to the embodiment.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. An apparatus comprising a first sub-pixel, a second sub-pixel, and a third sub-pixel, on a substrate, each of the first sub-pixel, the second sub-pixel, and the third sub-pixel including:
   a lower electrode;
   an insulating layer covering an end portion of the lower electrode;
   an organic layer arranged on the lower electrode and the insulating layer;
   an upper electrode arranged on the organic layer;
   a second insulating layer arranged over the upper electrode; and
   a microlens arranged over the upper electrode with the second insulating layer interposed therebetween and, in a planer view with respect to an upper surface of the lower electrode, overlapped with the lower electrode,
   wherein a top surface of the microlens protrudes toward a side opposite to the substrate with respect to the microlens,
   wherein an upper surface of the second insulating layer has a recess portion in the first sub-pixel, and
   wherein a side surface of the recess portion includes an inclined portion inclined at an acute angle to the upper surface of the lower electrode.

2. The apparatus according to claim 1, each of the first sub-pixel and the second sub-pixel, and the third sub-pixel including a reflecting layer arranged between the substrate and the lower electrode.

3. The apparatus according to claim 2, the first sub-pixel including a third insulating layer between the reflecting layer and the lower electrode.

4. The apparatus according to claim 3, the second sub-pixel including a fourth insulating layer between the reflecting layer and the lower electrode,
   wherein a thickness of the third insulating layer and a thickness of the fourth insulating layer are different from each other.

5. The apparatus according to claim 1, wherein a light emitted from the first sub-pixel is red light, a light emitted from the second sub-pixel is green light, and a light emitted from the third sub-pixel is blue light.

6. The apparatus according to claim 1, wherein the organic layer includes a light emitting layer, the light emitting layer being continuously arranged in at least two of regions, the regions including a first region being between a position on the lower electrode in the first sub-pixel and a position on the lower electrode in the second sub-pixel, a second region being between the position on the lower electrode in the second sub-pixel and a position on the lower electrode in the third sub-pixel, and a third region being between the position on the lower electrode in the third sub-pixel and the position on the lower electrode in the first sub-pixel.

7. The apparatus according to claim 1,
   wherein the first sub-pixel includes a first color filter on the upper electrode,
   wherein the second sub-pixel includes a second color filter on the upper electrode, and
   wherein the third sub-pixel includes a third color filter on the upper electrode.

8. The apparatus according to claim 1, wherein the organic layer emits white light.

9. A display apparatus comprising:
   the apparatus according to claim 1; and
   transistors electrically connected to the lower electrodes.

10. An wearable device comprising:
    an imaging apparatus; and
    the apparatus according to claim 1, as a display unit,
    wherein an image displayed on the display unit is controlled in accordance with information about a sight line of a user, the information being provided from the imaging apparatus.

11. A photoelectric conversion apparatus comprising:
    an optical unit including lenses;
    an imaging element arranged to receive light having passed through the optical unit; and
    a display unit configured to display an image taken by the imaging element,
    wherein the display unit includes the apparatus according to claim 1.

12. An electronic equipment comprising:
    a display unit including the apparatus according to claim 1;
    a casing in which the display unit is disposed; and
    a communication unit disposed in the casing and configured to communicate with an outside.

13. An illumination apparatus comprising:
a light source including the apparatus according to claim 1; and
a light diffuser or an optical film through which light emitted from the light source passes.

14. A moving object comprising:
a lighting including the apparatus according to claim 1; and
a body on which the lighting is disposed.

15. An apparatus comprising a first sub-pixel, a second sub-pixel, and a third sub-pixel, on a substrate, each of the first sub-pixel, the second sub-pixel, and the third sub-pixel including:
a lower electrode;
an insulating layer covering an end portion of the lower electrode;
an organic layer arranged on the lower electrode and the insulating layer;
an upper electrode arranged on the organic layer;
a second insulating layer arranged on the upper electrode;
a color filter arranged over the second insulating layer, and
a microlens arranged over the second insulating layer with the color filter interposed therebetween and, in a planer view with respect to an upper surface of the lower electrode, overlapped with the lower electrode,
wherein an upper surface of the second insulating layer has a recess portion in the first sub-pixel, and
wherein a side surface of the recess portion includes an inclined portion inclined at an acute angle to the upper surface of the lower electrode.

16. The apparatus according to claim 15, each of the first sub-pixel and the second sub-pixel, and the third sub-pixel including a reflecting layer arranged between the substrate and the lower electrode.

17. The apparatus according to claim 16, the first sub-pixel including a third insulating layer between the reflecting layer and the lower electrode.

18. The apparatus according to claim 17, the second sub-pixel including a fourth insulating layer between the reflecting layer and the lower electrode,
wherein a thickness of the third insulating layer and a thickness of the fourth insulating layer are different from each other.

19. The apparatus according to claim 15, wherein a light emitted from the first sub-pixel is red light, a light emitted from the second sub-pixel is green light, and a light emitted from the third sub-pixel is blue light.

20. The apparatus according to claim 15, wherein the organic layer includes a light emitting layer, the light emitting layer being continuously arranged in at least two of regions, the regions including a first region being between a position on the lower electrode in the first sub-pixel and a position on the lower electrode in the second sub-pixel, a second region being between the position on the lower electrode in the second sub-pixel and a position on the lower electrode in the third sub-pixel, and a third region being between the position on the lower electrode in the third sub-pixel and the position on the lower electrode in the first sub-pixel.

21. A display apparatus comprising:
the apparatus according to claim 15; and
transistors electrically connected to the lower electrodes.

22. An wearable device comprising:
an imaging apparatus; and
the apparatus according to claim 15, as a display unit,
wherein an image displayed on the display unit is controlled in accordance with information about a sight line of a user, the information being provided from the imaging apparatus.

23. A photoelectric conversion apparatus comprising:
an optical unit including lenses;
an imaging element arranged to receive light having passed through the optical unit; and
a display unit configured to display an image taken by the imaging element,
wherein the display unit includes the apparatus according to claim 15.

24. An electronic equipment comprising:
a display unit including the apparatus according to claim 15;
a casing in which the display unit is disposed; and
a communication unit disposed in the casing and configured to communicate with an outside.

* * * * *